(12) United States Patent
Maeda et al.

(10) Patent No.: US 7,129,543 B1
(45) Date of Patent: Oct. 31, 2006

(54) METHOD OF DESIGNING SEMICONDUCTOR DEVICE, SEMICONDUCTOR DEVICE AND RECORDING MEDIUM

(75) Inventors: Shigenobu Maeda, Tokyo (JP); Yasuo Yamaguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 914 days.

(21) Appl. No.: 09/176,315

(22) Filed: Oct. 22, 1998

(30) Foreign Application Priority Data

Mar. 27, 1998 (JP) ............................... P10-081456
Jun. 10, 1998 (JP) ............................... P10-162285

(51) Int. Cl.
*H01L 27/01* (2006.01)
(52) U.S. Cl. ..................................................... 257/347
(58) Field of Classification Search ................. 257/347
See application file for complete search history.

(56) References Cited

U.S. PATENT DOCUMENTS

| | | | |
|---|---|---|---|
| 3,855,610 A * | 12/1974 | Masuda et al. ................ | 357/23 |
| 4,257,825 A | 3/1981 | Schaumburg | |
| 4,443,930 A * | 4/1984 | Hwang et al. ................. | 29/571 |
| 4,899,202 A * | 2/1990 | Blake et al. ................. | 357/23.7 |
| 4,946,799 A | 8/1990 | Blake et al. | |
| 5,023,488 A * | 6/1991 | Gunning ..................... | 307/475 |
| 5,304,925 A | 4/1994 | Ebina | |
| 5,767,549 A * | 6/1998 | Chen et al. .................. | 257/347 |

FOREIGN PATENT DOCUMENTS

| | | | |
|---|---|---|---|
| DE | 196 23 846 A1 | | 4/1997 |
| DE | 44 41 901 A1 | | 5/1998 |
| EP | 0 605812 A1 | | 7/1994 |
| JP | 61 198753 | | 9/1986 |
| JP | 62-193170 | | 8/1987 |
| JP | 2-280371 | | 11/1990 |
| JP | 5-218426 | | 8/1993 |
| JP | 05 226619 | | 9/1993 |
| JP | 6-224302 | * | 8/1994 |
| JP | 07 022601 | | 1/1995 |
| JP | 8-64824 | | 3/1996 |

OTHER PUBLICATIONS

S. Maeda, et al., "Suppression of Delay Time Instability on Frequency Using Field Shield Isolation Technology For Deep Sub-Micron SOI Circuits", IEDM, 1996, pp. 129-132.

T. Iwamatsu, et al., "CAD-Compatible High-Speed CMOS/SIMOX Technology Using Field-Shield Isolation for 1M Gate Array", IEDM, 1993, pp. 475-478.

T. Iwamatsu, et al., "High-Speed 0.5 μm SOI ⅛Frequency Divider With Body-Fixed Structure For Wide Range of Applications", SSDM, 1995, pp. 575-577.

Modulationsdotierte Feldeffekttransistoren;Heiner Heiß; Dissertation am Lehrstuhl für Halbleitertechnologie der TU München; eingereicht am 31.10.1996, pp.59 to 69 (with English abstract).

Schumicki, Seegebrecht; Prozesstechnologie;paes 404 to 436; ; Springer Verlag; 1991 (with English abstract).

* cited by examiner

*Primary Examiner*—Sara Crane
(74) *Attorney, Agent, or Firm*—Oblon, Spivak, McClelland, Maier & Neustadt, P.C.

(57) ABSTRACT

A semiconductor device including a transistor having an SOI structure the operating speed of which is not affected is provided. A MOS transistor having the SOI structure is formed which satisfies $R \cdot C \cdot f < 1$ where C is a gate capacitance (F), R is a body resistance (Ω), f is a clock operating frequency (Hz), and $f \geq 500$ MHz.

20 Claims, 12 Drawing Sheets

METHOD OF DESIGNING SEMICONDUCTOR DEVICE, SEMICONDUCTOR DEVICE AND RECORDING MEDIUM

BACKGROUND OF THE INVENTION

1. Field of the Invention

The present invention relates to a semiconductor device having a MOS transistor formed on an SOI substrate.

2. Description of the Background Art

FIG. 20 is a perspective view showing a cross section of a conventional semiconductor device M90 having a field isolation structure which is the background of the present invention. The semiconductor device M90 is an SOI semiconductor device in which an SOI substrate including a semiconductor layer in film form, or an SOI (semiconductor-on-insulator) layer, which is formed on an insulating substrate is used as a semiconductor substrate into which transistor elements and the like are manufactured.

As shown in FIG. 20, the semiconductor device M90 comprises a silicon semiconductor layer as the SOI layer 3 formed on the insulating substrate including a supporting substrate 1 and a buried oxide film 2. The SOI layer 3 includes a great number of element regions wherein NMOS transistors are to be formed and a great number of element regions wherein PMOS transistors are to be formed. Planar field-shield electrodes (abbreviated hereinafter as "FS electrodes") 5 for electrical isolation of these element regions are formed on the boundaries of the element regions in the SOI layer 3.

The FS electrodes 5 shown in FIG. 20 are arranged in parallel and predetermined spaced relation on the SOI layer 3 so as to define active regions in the respective element regions. The FS electrodes 5 are covered with field-shield insulating layers 4 (abbreviated hereinafter as "FS insulating layers"). Gate electrodes 6 are disposed each of which extends from the top of an active region to the tops of two parallel FS insulating layers 4. Gate oxide films 10 are formed between the gate electrodes 6 and the active regions. The FS insulating layers 4 are made of an oxide to provide electrical insulation between the FS electrodes 5 and the gate electrodes 6.

Source and drain regions (not shown in FIG. 20) in the SOI layer 3 are electrically connected to drain and source electrodes (not shown in FIG. 20) through contact holes 7 provided in an insulating layer not shown. The gate electrodes 6 are connected to gate interconnect lines (not shown in FIG. 20) through contact holes 8.

A body contact electrode (not shown in FIG. 20) is connected through a contact hole 9 to the SOI layer 3. Although the contact hole 9 connected to the body contact electrode is shown in FIG. 20 as passing through the FS electrode 5 and connected to the SOI layer 3, it is also common to provide the contact hole 9 on the SOI layer 3 outside the FS electrode 5.

In the semiconductor device M90, the SOI layer 3 in an isolation region is cut off by applying 0 V in an NMOS structure or a power supply voltage Vcc in a PMOS structure to the FS electrodes 5. This results in electrical isolation between the element regions.

The SOI layer 3 may include a body portion which is floating rather than the body potential fixing contact hole 9 in the structure of FIG. 20.

FIG. 21 is a cross-sectional view of an NMOS transistor having an SOI structure in which a body portion is floating.

Referring to FIG. 21, the buried oxide film 2 is formed on the supporting substrate 1, and the SOI layer 3 is formed on the buried oxide film 2. An N-type drain region 11 and an N-type source region 12 are selectively formed in the SOI layer 3. A P-type region of the SOI layer 3 which includes a body region between the drain and source regions 11 and 12 is defined as a body portion 13.

The gate oxide film 10 is formed on the body portion 13 between the drain and source regions 11 and 12, and the gate electrode 6 is formed on the gate oxide film 10.

In the SOI MOS transistor constructed as above described, if the potential of the body portion 13 is not fixed, a body potential BV is changed by the influences of signals flowing through the drain region 11 and the source region 12 and the like, accordingly changing the operating speed VC of the MOS transistor, as shown in FIG. 22. It should be noted that the relationship of FIG. 22 between the body potential and the operating speed is shown as relative values on the basis of time=0.

One of the solutions to the above described drawback is to fix the potential of the body portion 13 by providing the body potential fixing contact hole 9 shown in FIG. 20 and the like. FIG. 23 schematically illustrates a MOS transistor structure wherein the body potential is fixed. As shown in FIG. 23, the potential of the body portion 13 is fixed by a body terminal PB1.

An alternative solution is to provide a DT (Dynamic Threshold) MOS structure as shown in FIG. 24 in which the gate electrode 6 and the body portion 13 are short-circuited and a body terminal PB2 applies a common potential to the gate electrode 6 and the body portion 13.

Conventional SOI MOS transistors are capable of stabilizing the operating speed which is relatively low by fixing the potential of the body portion 13 as depicted in FIGS. 23 and 24.

However, a high-speed operation in synchronism with a clock having an operating frequency of not less than 500 MHz imposes very stringent requirements for the timing of signal passing between circuits. This causes even the MOS transistors having the structures of FIGS. 23 and 24 to encounter a phenomenon similar to that caused in the case where the body portion 13 is floating. This phenomenon affects the operating speed of such MOS transistors, for example, an unstable operation thereof.

SUMMARY OF THE INVENTION

A first aspect of the present invention is intended for a method of designing a semiconductor device including a MOS transistor formed on an SOI substrate including a supporting substrate, a buried oxide film and an SOI layer, the MOS transistor being operated based on a predetermined clock, the MOS transistor comprising: a first semiconductor region of a first conductivity type and selectively formed in the SOI layer; a second semiconductor region of the first conductivity type and selectively formed in the SOI layer independently of the first semiconductor region; a body portion of a second conductivity type and including a body region, the body region being a region of the SOI layer which lies between the first and second semiconductor regions; a gate electrode formed on a gate oxide film formed on the body region; and at least one body contact electrically connected to the body portion and receiving a fixed potential. According to the present invention, the method comprises the steps of: (a) providing an operating frequency of the predetermined clock; and (b) determining a layout pattern of the MOS transistor based on the operating frequency of the predetermined clock, wherein the layout pattern of the MOS transistor is determined in the step (b) so as to satisfy the conditional expression R·C·f<1 where C=the gate capacitance (F) of the MOS transistor, R=the resistance (Ω) of a fixed potential transmission path extending from the at least one body contact to the body region, f=the operating frequency (Hz) of the predetermined clock, and f≧500 MHz.

A second aspect of the present invention is intended for a method of designing a semiconductor device including a MOS transistor formed on an SOI substrate including a supporting substrate, a buried oxide film and an SOI layer, the MOS transistor comprising: a first semiconductor region of a first conductivity type and selectively formed in the SOI layer; a second semiconductor region of the first conductivity type and selectively formed in the SOI layer independently of the first semiconductor region; a body portion of a second conductivity type and including a body region, the body region being a region of the SOI layer which lies between the first and second semiconductor regions; a gate electrode formed on a gate oxide film formed on the body region, the gate electrode being electrically connected to the body portion; and at least one body contact electrically connected to the body portion and receiving a fixed potential. According to the present invention, the method comprises the steps of: (a) providing a signal propagation delay time required for the MOS transistor; and (b) determining a layout pattern of the MOS transistor based on the signal propagation delay time, wherein the layout pattern of the MOS transistor is determined in the step (b) so as to satisfy the conditional expression (R·C)/td<1 where C=the gate capacitance (F) of the MOS transistor, R=the resistance (Ω) of a fixed potential transmission path extending from the at least one body contact to the body region, td=signal propagation delay time (s) required for the MOS transistor, and td≦50 ps.

A third aspect of the present invention is intended for a semiconductor device designed by the method as recited in the first aspect.

A fourth aspect of the present invention is intended for a semiconductor device designed by the method as recited in the second aspect.

Preferably, according to a fifth aspect of the present invention, in the semiconductor device of the third aspect, the resistance R of the fixed potential transmission path is determined by R=(ρ·W)/(L·$t_{SOI}$) where W=the length of the fixed potential transmission path in the body region along the gate width of the gate electrode, L=the length of the fixed potential transmission path in the body region along the gate length of the gate electrode, $t_{SOI}$=the thickness of the SOI layer, and ρ=the resistivity of the body region.

Preferably, according to a sixth aspect of the present invention, in the semiconductor device of the fifth aspect, the body portion includes a region extending from the body region in abutting relation with at least part of an outer periphery of the first and second semiconductor regions; and the MOS transistor further comprises an isolation electrode formed on an insulating film formed on part of the body portion which is other than the body region and is in abutting relation with at least part of the outer periphery of the first and second semiconductor regions, the at least one body contact including an out-of-isolation-electrode body contact formed on a region of the body portion which is opposed, as seen in plan view, to the first and second semiconductor regions, with the isolation electrode therebetween.

Preferably, according to a seventh aspect of the present invention, in the semiconductor device of the sixth aspect, the body region includes a body contact definable region wherein the body contact is permitted to be formed; the gate electrode has an opening that exposes the body contact definable region; and the at least one body contact further includes an in-gate-electrode body contact formed on the body contact definable region.

Preferably, according to an eighth aspect of the present invention, in the semiconductor device of the sixth aspect, the first semiconductor region includes a plurality of first semiconductor regions, and the second semiconductor region includes a plurality of second semiconductor regions; the body portion includes a region formed between the plurality of first and second semiconductor regions so as to isolate the plurality of first and second semiconductor regions into discrete relationship; and the isolation electrode is further formed on the region of the body portion which isolates the plurality of first and second semiconductor regions into discrete relationship.

Preferably, according to a ninth aspect of the present invention, in the semiconductor device of the fifth aspect, the body portion includes a region disposed in abutting relation with the first and second semiconductor regions along the gate width and extending from the body region along the gate length; the gate electrode is formed on part of the body portion which is disposed in abutting relation with the first and second semiconductor regions along the gate width, and extends further from on the body region along the gate length; and the at least one body contact includes an out-of-gate-electrode body contact formed on the region of the body portion which is opposed, as seen in plan view, to the first and second semiconductor regions, with the gate electrode therebetween.

Preferably, according to a tenth aspect of the present invention, in the semiconductor device of the ninth aspect, the body region includes a body contact definable region in which the body contact is permitted to be formed; the gate electrode has an opening that exposes the body contact definable region; and the at least one body contact further includes an in-gate-electrode body contact formed on the body contact definable region.

Preferably, according to an eleventh aspect of the present invention, in the semiconductor device of the fifth aspect, the at least one body contact includes: a first body contact formed on the body portion in a position located on an outward extension line from one end of the gate electrode along the gate width, and a second body contact formed on the body portion in a position located on an outward extension line from the other end of the gate electrode along the gate width.

Preferably, according to a twelfth aspect of the present invention, in the semiconductor device of the fifth aspect, the body region includes a first body region at least part of which is formed in an upper part thereof, and a second body region formed in a lower part thereof, the second body region of the second conductivity type being of an impurity concentration higher than the impurity concentration of the first body region of the second conductivity type.

Preferably, according to a thirteenth aspect of the present invention, in the semiconductor device of the twelfth aspect, the first semiconductor region includes a first main region and a first partial semiconductor region, and the second semiconductor region includes a second main region and a second partial semiconductor region, the first and second partial semiconductor regions being formed in opposed relation in upper partial regions of the first and second semiconductor regions, the first and second partial semiconductor regions of the first conductivity type being of an impurity concentration lower than the impurity concentration of the first and second main regions of the first conductivity type; the second body region includes first and second partial body regions; the first and second partial body regions are formed under parts of the first and second partial semiconductor regions and in interface contact with the first and second main regions, respectively, the body region in other than the first and second partial body regions being defined as the first body region; and the first body region is formed out of interface contact with the first and second main regions, and the first and second partial semiconductor regions extend a predetermined distance from the first and second partial body regions toward the center of the gate electrode.

Preferably, according to a fourteenth aspect of the present invention, in the semiconductor device of the twelfth aspect, the first semiconductor region includes a first main region and a first partial semiconductor region, and the second semiconductor region includes a second main region and a second partial semiconductor region, the first and second partial semiconductor regions being formed in opposed relation in partial regions of the first and second semiconductor regions and extending vertically through the SOI layer, the first and second partial semiconductor regions of the first conductivity type being of an impurity concentration lower than the impurity concentration of the first and second main regions of the first conductivity type.

Preferably, according to a fifteenth aspect of the present invention, in the semiconductor device of the twelfth aspect, the first semiconductor region includes a first main region and a first partial semiconductor region, and the second semiconductor region includes a second main region and a second partial semiconductor region, the first and second partial semiconductor regions being formed in opposed relation in partial regions of the first and second semiconductor regions, the first and second partial semiconductor regions of the first conductivity type being of an impurity concentration lower than the impurity concentration of the first and second main regions of the first conductivity type; and the second body region is formed in a lower central part of the body region and out of interface contact with the first and second main regions.

Preferably, according to a sixteenth aspect of the present invention, the semiconductor device of the fifth aspect further comprises: a body floating MOS transistor having an unfixed body potential, the SOI layer including a first region having a first thickness, and a second region having a second thickness less than the first thickness, the MOS transistor being formed on the first region, the body floating MOS transistor being formed on the second region.

A seventeenth aspect of the present invention is intended for a computer readable recording medium which records thereon a program for embodying the method as recited in the first or second aspect.

As described hereinabove, in the method of the first aspect of the present invention, the layout pattern of the MOS transistor is determined in the step (b) so as to satisfy the conditional expression R·C·f<1 where C=the gate capacitance (F) of the MOS transistor, R=the resistance (Ωm) of the fixed potential transmission path extending from the at least one body contact to the body region, f=the operating frequency (Hz) of the predetermined clock, and f≧500 MHz. This allows the design of the body potential fixed MOS transistor which is stable in operating speed also during the high-speed operation thereof.

In the method of the second aspect of the present invention, the layout pattern of the MOS transistor is determined so as to satisfy the conditional expression (R·C)/td<1 where C=the gate capacitance (F) of the MOS transistor, R=the resistance (Ωm) of the fixed potential transmission path extending from the at least one body contact to the body region, td=the signal propagation delay time (s) required for the MOS transistor, and td≦50 ps. This allows the design of the MOS transistor having the short-circuited gate electrode and body portion and stable in operating speed also during the high-speed operation thereof.

The semiconductor device of the third aspect is designed by the method of the first aspect. This provides the body potential fixed MOS transistor which is stable in operating speed also during the high-speed operation thereof.

The semiconductor device of the fourth aspect is designed by the method of the second aspect. This provides the MOS transistor having the short-circuited gate electrode and body portion and stable in operating speed also during the high-speed operation thereof.

In the semiconductor device in accordance with the fifth aspect of the present invention, the resistance R of the body portion is determined by $R=(\rho \cdot W)/(L \cdot t_{SOI})$ where W=the length of the fixed potential transmission path in the body region along the gate width of the gate electrode, L=the length of the fixed potential transmission path in the body region along the gate length of the gate electrode, $t_{SOI}$=the thickness of the SOI layer, and ρ=the resistivity of the body region. Thus, the allowable range of the size of the body region may be determined by previously setting the thickness of the SOI layer and the resistivity of the body region.

In the semiconductor device in accordance with the sixth aspect of the present invention, the MOS transistor further comprises the isolation electrode formed on the insulating film formed on part of the body portion which is other than the body region and is in abutting relation with the first and second semiconductor regions, and the out-of-isolation-electrode body contact formed on the region of the body portion which is opposed, as seen in plan view, to the first and second semiconductor regions, with the isolation electrode therebetween. Electrical isolation may be provided between the out-of-isolation-electrode body contact and the first and second semiconductor regions by applying a reverse bias voltage to the isolation electrode, thereby preventing the fixed potential from the out-of-isolation-electrode body contact from adversely affecting the first and second semiconductor regions.

In the semiconductor device in accordance with the seventh aspect of the present invention, the gate electrode has the opening that exposes the body contact definable region of the body region, and the body contact further includes the in-gate-electrode body contact formed on the body contact definable region.

Thus, the fixed potential transmission path in the body region is divided by the in-gate-electrode body contact into body region units each of which is required to satisfy the conditional expression of the first aspect or the second aspect. This provides the increased length of the entire body region along the gate width of the gate electrode.

In the semiconductor device in accordance with the eighth aspect of the present invention, the plurality of first and second semiconductor regions are isolated from each other by the body portion.

Thus, the fixed potential transmission path in the body region is divided by the body portion which isolates the plurality of first and second semiconductor regions. Each of the plurality of first and second semiconductor regions of the MOS transistor is required to satisfy the conditional expression of the first aspect or the second aspect. This provides the increased length of the entire body region along the gate width of the gate electrode.

In the semiconductor device in accordance with the ninth aspect of the present invention, the gate electrode is formed on the part of the body portion which is disposed in abutting relation with the first and second semiconductor regions, and extends further from on the body region along the gate length. The out-of-gate-electrode body contact is formed on the region of the body portion which is opposed, as seen in plan view, to the first and second semiconductor regions, with the gate electrode therebetween.

Electrical isolation may be provided between the out-of-gate-electrode body contact and the first and second semiconductor regions by applying an OFF voltage to the gate electrode, thereby preventing the fixed potential from the out-of-gate-electrode body contact from adversely affecting the first and second semiconductor regions.

In the semiconductor device in accordance with the tenth aspect of the present invention, the gate electrode has the opening that exposes the body contact definable region of the body region, and the body contact further includes the in-gate-electrode body contact formed on the body contact definable region.

Thus, the fixed potential transmission path in the body region is divided by the in-gate-electrode body contact into body region units. The MOS transistor is required to satisfy the conditional expression of the first aspect or the second aspect for each of the body region units. This provides the increased length of the entire body region along the gate width of the gate electrode.

In the semiconductor device in accordance with the eleventh aspect of the present invention, the at least one body contact includes the first and second body contacts formed on the body portion in the positions located on the outward extension lines from the opposite ends of the gate electrode along the gate width of the gate electrode, respectively.

Thus, the fixed potential transmission path in the body region is divided by the first and second body contacts into body region units. The MOS transistor is required to satisfy the conditional expression of the first aspect or the second aspect for each of the two body region units. This provides the increased length of the entire body region along the gate width of the gate electrode.

In the semiconductor device in accordance with the twelfth aspect of the present invention, the second body region of the second conductivity type and formed in the lower part of the body region is of the impurity concentration higher than the impurity concentration of the first body region of the second conductivity type. This structure provides the decreased resistivity of the body region relative to a structure wherein the entire body region is of the impurity concentration of the first body region.

As a result, if all of the parameters satisfying the conditional expression of the first or second aspect but the resistivity of the body region and the length of the fixed potential transmission path in the body region along the gate width of the gate electrode are under the same conditions, this structure provides the decreased resistivity of the body region to accordingly increase the above-mentioned length along the gate width.

In the semiconductor device in accordance with the thirteenth aspect of the present invention, the first and second partial body regions of the relatively high impurity concentration are formed in interface contact with the first and second main regions of the relatively high impurity concentration, and the first body region of the relatively low impurity concentration is formed out of interface contact with the first and second main regions. This permits the first and second partial body regions to ensure the suppression of the extension of a depletion layer from the first and second main regions, thereby rendering the MOS transistor resistant to punch-through.

Further, the first and second partial semiconductor regions of the relatively low impurity concentration extend the predetermined distance from the first and second partial body regions toward the center of the gate electrode, respectively. This prevents the relatively high impurity concentration of the first and second partial body regions from adversely affecting the current characteristics of the MOS transistor during channel formation.

In the semiconductor device in accordance with the fourteenth aspect of the present invention, the first and second partial semiconductor regions of the relatively low impurity concentration are formed in opposed relation in partial regions of the first and second semiconductor regions, and extend vertically through the SOI layer.

Thus, the second body region of the relatively high impurity concentration is out of interface contact with the first or second semiconductor region of the relatively high impurity concentration. Therefore, junction leakage is minimized.

In the semiconductor device in accordance with the fifteenth aspect of the present invention, the second body region of the relatively high impurity concentration is formed in the lower central part of the body region and out of interface contact with the first and second main regions.

Thus, no interface contact between the second body region of the relatively high impurity concentration and the first or second semiconductor region of the relatively high impurity concentration may minimize the junction leakage.

In the semiconductor device in accordance with the sixteenth aspect of the present invention, the body potential fixed MOS transistor is formed on the first region which is relatively thick, and the body floating MOS transistor is formed on the second region which is relatively thin.

Consequently, if all of the parameters satisfying the conditional expression of the first or second aspect but the thickness of the SOI layer and the length of the body region along the gate width of the gate electrode are under the same conditions, this structure provides the increased thickness of the SOI layer to accordingly increase the length of the body region along the gate width of the body potential fixed MOS transistor.

The body floating MOS transistor, on the other hand, may comprise the SOI layer of the decreased thickness for desired operating characteristics without affecting the body potential fixed MOS transistor.

The recording medium in accordance with the seventeenth aspect of the present invention records thereon the program for embodying the method of the first or second aspects. Thus, the execution of the program by a computer allows the design of a body potential fixed MOS transistor or MOS transistor having the short-circuited gate electrode and body portion which is stable in operating speed also during the high-speed operation thereof.

It is therefore an object of the present invention to provide a semiconductor device including an SOI transistor the operating speed of which is not affected during a high-speed operation, and a method of designing the semiconductor device.

These and other objects, features, aspects and advantages of the present invention will become more apparent from the

DESCRIPTION OF THE PREFERRED EMBODIMENTS

First Preferred Embodiment

Figure 1:
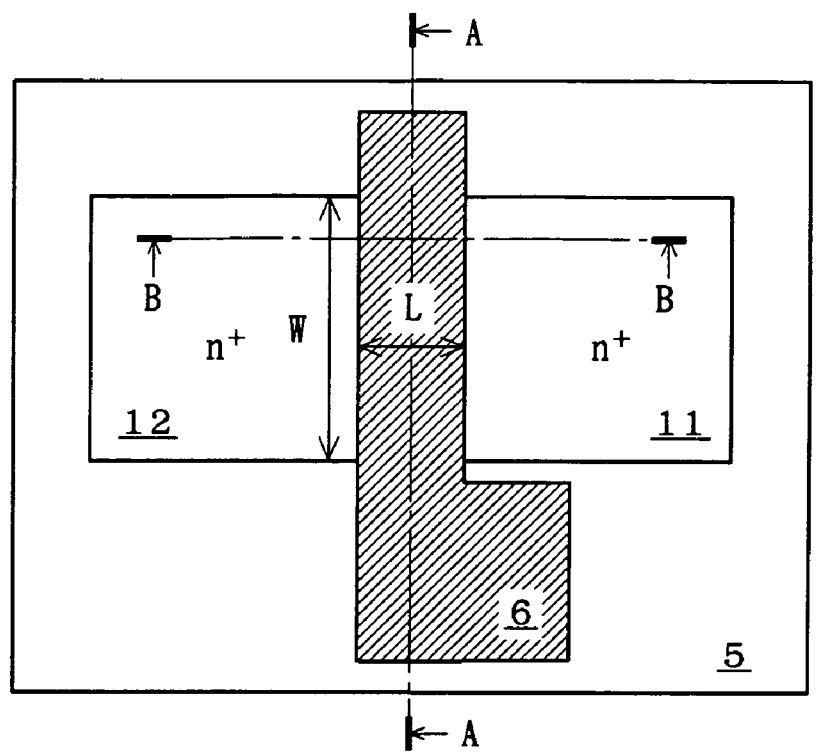
FIG. 1 is a plan view of a MOS transistor having an SOI structure designed by a designing method according to a first preferred embodiment of the present invention.
Figure 2:
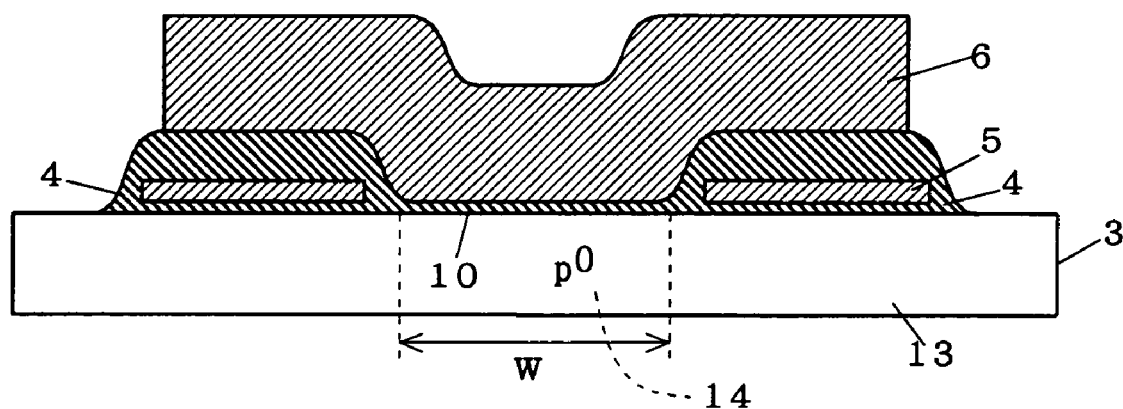
FIG. 2 is a cross-sectional view taken along the line A—A of FIG. 1.

FIG. 1 is a plan view of an NMOS transistor having an SOI structure employing FS isolation which is designed by a semiconductor device designing method according to a first preferred embodiment of the present invention. FIG. 2 is a cross-sectional view taken along the line A—A of FIG. 1. As shown in FIGS. 1 and 2, an FS electrode 5 is formed on an FS insulating layer 4 provided on part of a body portion 13 which lies on the periphery of and adjacent to an N-type drain region 11 and an N-type source region 12. The body portion 13 is defined to include a body region 14 between the drain region 11 and the source region 12, and a P-type region extending from the body region 14.

A gate electrode 6 is formed over the body region 14 and parts of the FS electrode 5. The gate electrode 6 is formed over the body region 14 with a gate oxide film 10 therebetween, and is formed over the parts of the FS electrode 5 with the FS insulating layer 4 therebetween. Although not shown in FIGS. 1 and 2, a body contact is formed on the body portion 13 on the outer periphery, as seen in plan view, of the FS electrode 5.

Such a structure defines the MOS transistor including the drain region 11, the source region 12, and the gate electrode 6 having a gate length L and a gate width W.

In the MOS transistor employing the FS isolation and having such a structure, a body potential is not directly transmitted from the body portion 13 on the outer periphery of the drain region 11 and the source region 12 except the body region 14 to the drain region 11 and the source region 12 during the time the isolation function of the FS electrode 5 is active.

A gate capacitance C of the gate electrode 6 having the gate length L and the gate width W in such a MOS transistor is determined by $$C = K_0 \varepsilon_0 \frac{L \cdot W}{t_{OX}} \tag{1}$$

where $t_{OX}$ is the thickness of the gate oxide film 10, $\varepsilon_0$ is the dielectric constant of vacuum, and $K_0$ is the relative dielectric constant of the gate oxide film 10.

On the other hand, the body resistance R of the body portion 13 which corresponds to the resistance of a fixed potential transmission path extending from a body contact 16 to the body region 14 is substantially determined by the resistance of the body region 14 under the gate electrode 6 in the direction of the line A—A. This is because the region of the body portion 13 other than the body region 14 serves as a fixed potential transmission path having a sufficiently great width relative to the gate length L, and thus has a resistance which is on a negligible level relative to the resistance of the body region 14.

Hence, the body resistance R is $$R = \rho \cdot \frac{W}{L \cdot t_{SOI}} \tag{2}$$

where $\rho$ is the resistivity of the body region 14, and $t_{SOI}$ is the thickness of an SOI layer 3.

More precisely, the gate length L in Expression (2) is the length of the fixed potential transmission path in the body region 14 along the gate length of the gate electrode 6, and the gate width W in Expression (2) is the length of the fixed potential transmission path in the body region 14 along the gate width of the gate electrode 6. Expression (2) is determined herein on the assumption that the length of the fixed potential transmission path in the body region 14 along the gate width generally equals the gate width W of the gate electrode 6 and the length thereof along the gate length generally equals the gate length L of the gate electrode 6.

The result of simulation based on a clock operating frequency f (Hz) at which a MOS transistor having the gate capacitance C (F) and body resistance R (Ω) determined in Expressions (1) and (2) has revealed that, when a high-speed operation at the clock operating frequency f of not less than 500 MHz is required, the MOS transistor operates in a stable state if conditions represented by Expression (3) are satisfied.

$$R \cdot C \cdot f < 1 \quad (3)$$

By applying Expressions (1) and (2) to Expression (3), Expression (3) may be transformed into $$R \cdot C \cdot f = \rho \cdot K_0 \cdot \varepsilon_0 \cdot \frac{W^2}{t_{OX} \cdot t_{SOI}} \cdot f < 1 \quad (4)$$

Therefore, a circuit comprising the SOI MOS transistor having the gate width W, the gate oxide film thickness $t_{OX}$, and the SOI layer thickness $t_{SOI}$ all of which satisfy Expression (4) when the clock operating frequency f is determined operates in a stable state also at high operating speed.

For instance, if $\rho=0.08$ (Ω·cm), $K_0=3.9$, $\varepsilon_0=8.86\times10^{-14}$ (F/cm), and f=10 (GHz), then the gate width W, the gate oxide film thickness $t_{OX}$, and the SOI layer thickness $t_{SOI}$ should satisfy conditions expressed by $$\frac{W^2}{t_{OX} \cdot t_{SOI}} < \frac{1}{\rho \cdot K_0 \cdot \varepsilon_0 \cdot f} = 3.6 \times 10^3 \quad (5)$$

Then, if the gate oxide film thickness $t_{OX}$=0.007 (μm) and the SOI layer thickness $t_{SOI}$=0.1 (μm), the restrictive condition (i) that $\{W^{2<2.52}\}$, or $\{W<1.59$ (μm)$\}$, should be satisfied.

Figure 3:
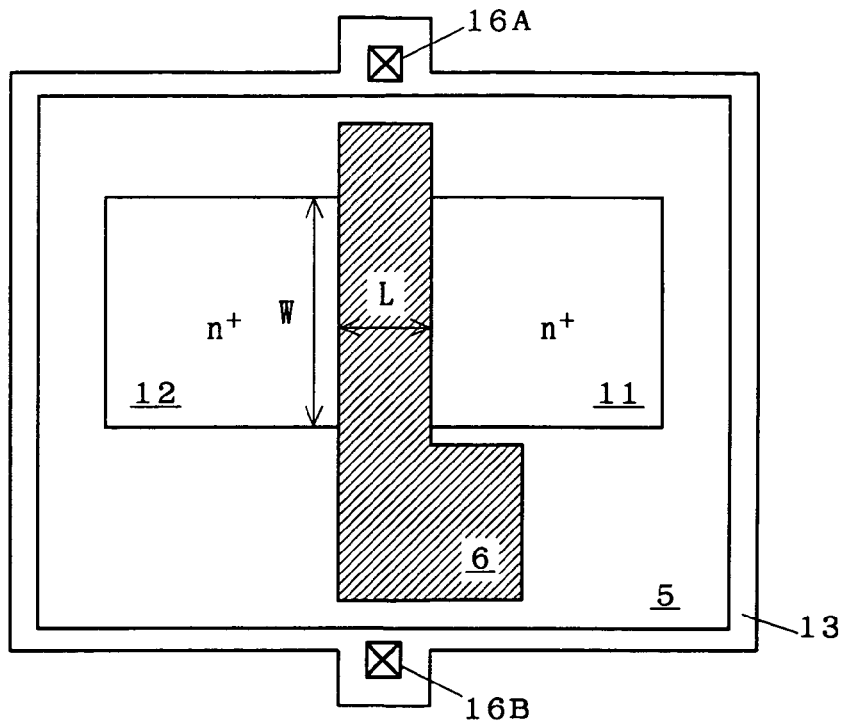
FIG. 3 is a plan view showing a body contact structure of the first preferred embodiment.

With reference to FIG. 3, however, when body contacts 16A and 16B are provided on the body portion 13 on opposite sides of the gate electrode 6 along the gate width W, the fixed potential transmission path in the body region 14 is divided into two paths associated respectively with the body contacts 16A and 16B. Then, Expressions (1) through (4) may be applied to each of two body regions having a gate width W/2. Consequently, the restrictive condition (ii) that $\{(W/2)<1.59$ (μm)$\}$ should be satisfied. This permits the maximum allowable gate width W to be twice greater than that based on the restrictive condition (i).

Figure 4:
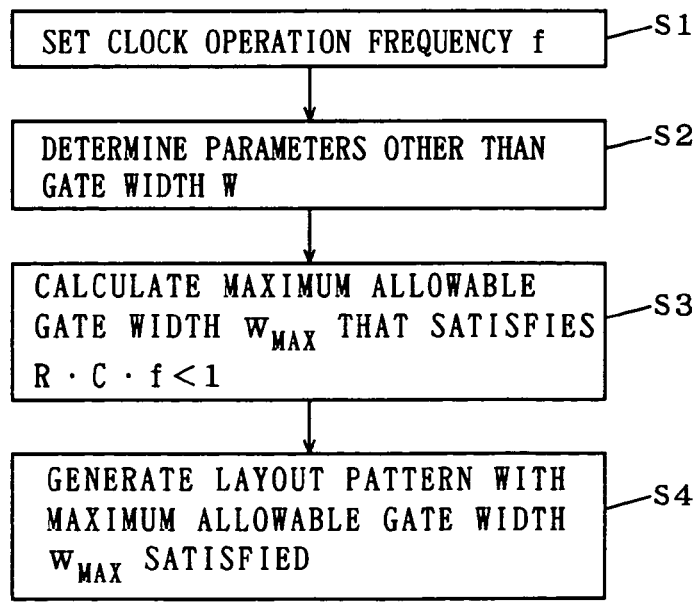
FIG. 4 is a flowchart showing the procedure of the method of designing the semiconductor device according to the first preferred embodiment.

FIG. 4 is a flowchart showing the procedure of the semiconductor device designing method according to the first preferred embodiment of the present invention.

Referring to FIG. 4, the clock operating frequency f (≧500 MHz) is initially set in the step S1. Then, parameters other than the gate width W, such as the gate oxide film thickness $t_{OX}$ and the SOI layer thickness $t_{SOI}$, are determined in the step S2.

Subsequently, a maximum allowable gate width $W_{MAX}$ that satisfies R·C·f<1 is determined by applying Expression (4) in the step S3.

In the step S4, a layout pattern including a MOS transistor that satisfies the maximum allowable gate width $W_{MAX}$ is generated to design a semiconductor device.

Thus, the semiconductor device designing method of the first preferred embodiment uses the expression {R·C·f<1} for designing the device. Therefore, a designer may constantly obtain the semiconductor device which ensures a stable operation at a frequency at which the device is to be operated, based on only objective recognition rather than trial and error. That is, the method of the first preferred embodiment is effective in that the use of the expression {R·C·f<1} allows the precise recognition of the maximum allowable gate width $W_{MAX}$ which permits the device to operate in a stable manner when a predetermined frequency is provided.

Although the gate width W is used as the parameter whose final allowable value (maximum allowable gate width $W_{MAX}$) is determined in the flowchart shown in FIG. 4, the allowable value of any parameter which satisfies {R·C·f<1} may be determined. Additionally, the technique of the first preferred embodiment is, of course, applicable to the allowable values of a combination of two or more parameters.

Figure 5:
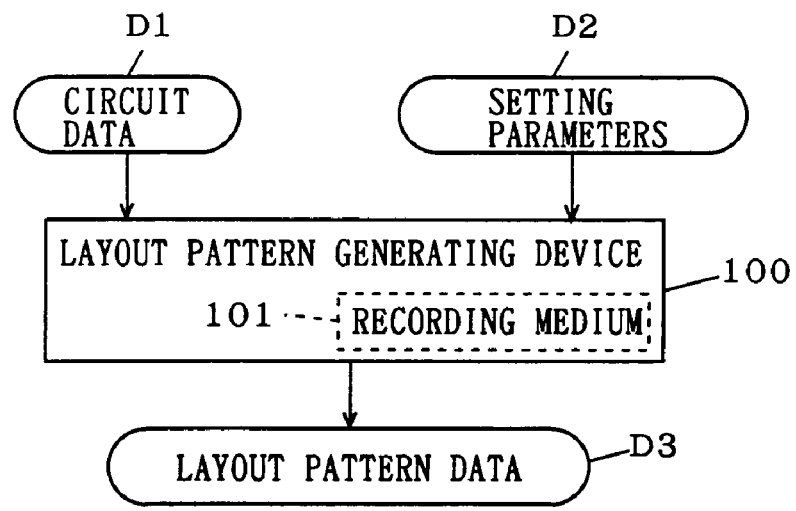
FIG. 5 is a block diagram of a layout pattern generating device for implementing the designing method of the first preferred embodiment.

FIG. 5 is a block diagram of a layout pattern generating device for automatically implementing the semiconductor device designing method of the first preferred embodiment. As shown in FIG. 5, the layout pattern generating device 100 receives circuit data D1 and setting parameters D2. The setting parameters D2 means the clock operating frequency f, and the parameters other than the gate width W, such as the gate oxide film thickness $t_{OX}$ and the SOI layer thickness $t_{SOI}$.

The layout pattern generating device 100 has a function as a computer which is capable of executing a layout pattern generating program recorded on a recording medium 101 provided therein. In the first preferred embodiment, the layout pattern generating program contains the steps, similar to the steps S1 and S2 of FIG. 4, of providing the clock operating frequency f to be set and the parameters other than the gate width W, and the steps of executing the same processing as the steps S3 and S4 of FIG. 4.

Thus, the layout pattern generating device 100 is capable of automatically generating layout pattern data D3 including a MOS transistor which satisfies the expression {R·C·f<1} based on the provided circuit data D1 and setting parameters D2. The recording medium 101 may comprise, for example, a floppy disk, a CD-ROM, and a hard disk.

Figure 6:
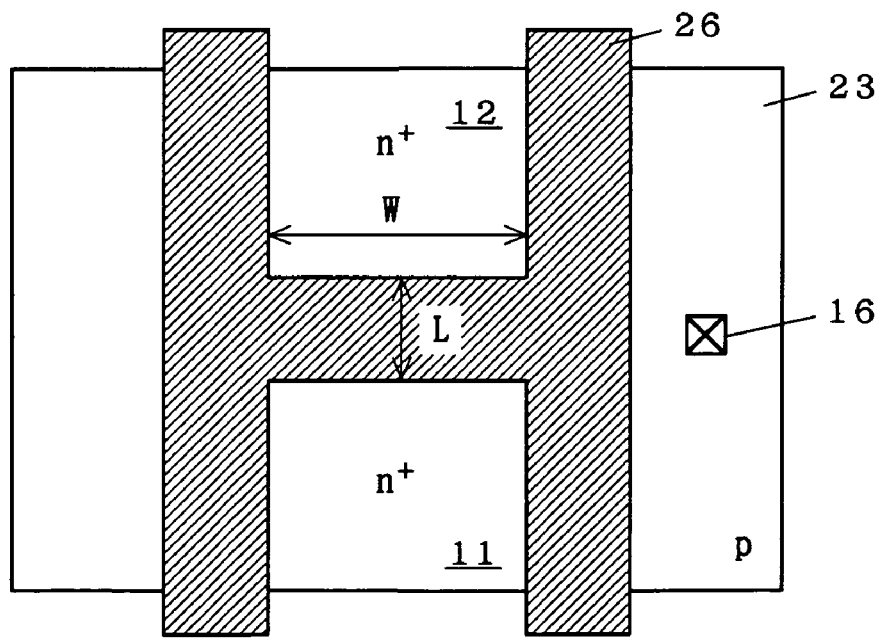
FIG. 6 is a plan view showing an H-shaped gate electrode structure of the first preferred embodiment.

Although the method of designing the MOS transistor having the FS isolation structure is described in the first preferred embodiment, the technique of the first preferred embodiment may be applied to a method of designing an H-shaped gate structure as shown in FIG. 6. A pair of opposed I-shaped parts of an H-shaped gate electrode 26 which correspond to the stems of the letter "H" provide electrical isolation between body portions 23 arranged adjacent to the drain and source regions 11 and 12 along the gate width W and the drain and source regions 11 and 12. A middle part of the H-shaped gate electrode 26 which corresponds to the bar of the letter "H" functions as the original gate electrode of the MOS transistor.

Then, if the body contact 16 is formed on the body portions 23 opposed to the drain and source regions 11 and 12 with respect to the H-shaped gate electrode 26, the body potential from the body contact 16 is not directly transmitted to the drain and source regions 11 and 12.

In this manner, the SOI MOS transistor of the first preferred embodiment is designed so that the gate width W, the gate oxide film thickness $t_{OX}$, and the SOI layer thickness $t_{SOI}$ satisfy Expression (3) (Expression (4)) for body potential fixing, providing an operation-stabilized semiconductor device which precludes variations in operating speed also during the high-speed operation.

Setting the maximum gate width W which satisfies Expression (3) provides the SOI MOS transistor that operates at a maximum speed which allows the stable operation.

The clock operating frequency f in Expression (3) means an operating frequency, a clock frequency, and an oscillation frequency when the SOI MOS transistor of the first preferred embodiment is used for a synchronous logic circuit such as a CPU, a DSP, and a communication chip, and means an operating frequency, a clock frequency, and the reciprocal of access time when the SOI MOS transistor is used for a semiconductor memory such as a DRAM and an SRAM.

Second Preferred Embodiment

The result of simulation, similar to that of the first preferred embodiment, which is based on a signal propagation delay time $t_{pd}$ (s) required for a single DT MOS transistor having the gate capacitance C (F) and body resistance R (Ω) determined in Expressions (1) and (2) has revealed that the DT MOS transistor operates in a stable state also during the high-speed operation with the signal propagation delay time $t_{pd}$ of not greater than 50 ps if conditions represented by Expression (6) are satisfied.

$$\frac{R \cdot C}{t_{pd}} < 1 \quad (6)$$

For instance, if $\rho=0.08$ (Ω·cm), $K_0=3.9$, $\epsilon_0=8.86\times 10^{-14}$ (F/cm), and $t_{pd}=50$ (ps), then the gate width W, the gate oxide film thickness $t_{OX}$, and the SOI layer thickness $t_{SOI}$ should satisfy conditions expressed by $$\frac{W^2}{t_{OX} \cdot t_{SOI}} < \frac{t_{pd}}{\rho \cdot K_0 \cdot \epsilon_0} = 1.8 \times 10^3 \quad (7)$$

Then, if the gate oxide film thickness $t_{OX}=0.007$ (μm) and the SOI layer thickness $t_{SOI}=0.1$ (μm), the restrictive condition (iii) that $\{W^2<1.26\}$, or $\{W<1.12$ (μm)$\}$, should be satisfied.

When a short circuit is established between the gate electrode and the body portions on opposite sides of the gate electrode along the gate width W thereof, the fixed potential transmission path in the body region 14 is divided into two paths as in the first preferred embodiment. Consequently, the restrictive condition (iv) that $\{(W/2)<1.12$ (μm)$\}$ should be satisfied. This permits the maximum allowable gate width W to be twice greater than that based on the restrictive condition (iii).

The DT MOS transistor of the second preferred embodiment is similar in construction to the MOS transistor shown in FIGS. 1 and 2 except that the gate electrode 6 and the body portion are short-circuited, and may be applied to the H-shaped gate structure shown in FIG. 6.

Figure 7:
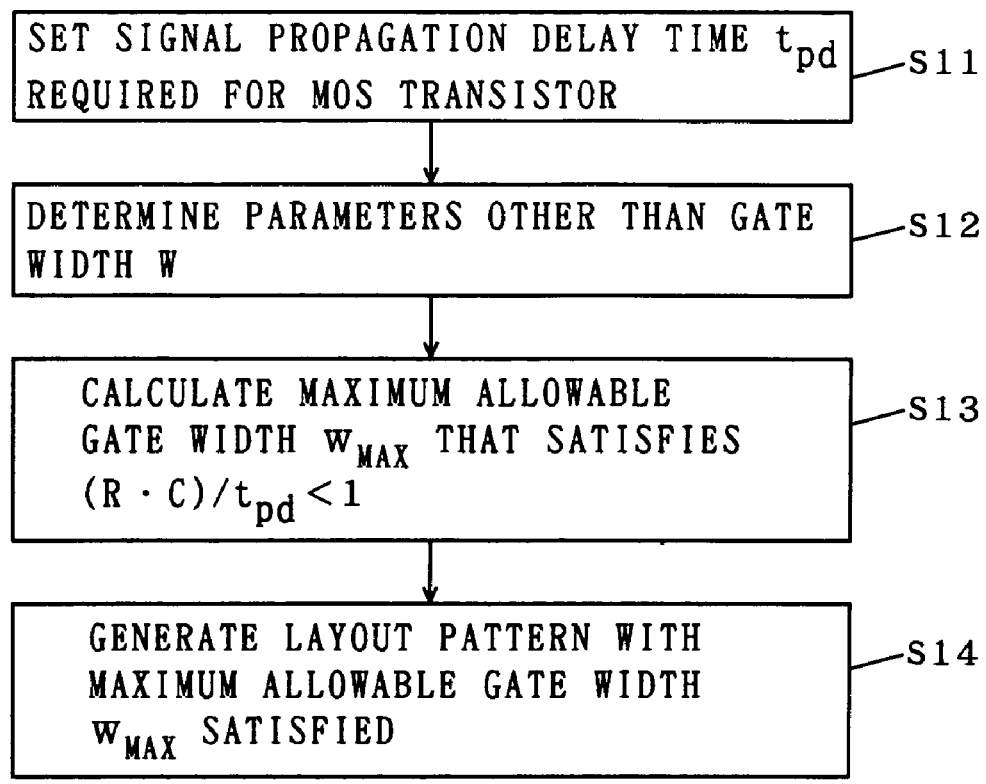
FIG. 7 is a flowchart showing the procedure of the method of designing the semiconductor device according to a second preferred embodiment of the present invention.

FIG. 7 is a flowchart showing the procedure of the semiconductor device designing method according to the second preferred embodiment of the present invention.

Referring to FIG. 7, the signal propagation delay time $t_{pd}(\leq 50$ ps) required for the single DT MOS transistor is initially set in the step S11. Then, parameters other than the gate width W, such as the gate oxide film thickness $t_{OX}$ and the SOI layer thickness $t_{SOI}$, are determined in the step S12.

Subsequently, the maximum allowable gate width $W_{MAX}$ that satisfies $(R\cdot C)/t_{pd}<1$ is determined by applying Expression (7) in the step S13.

In the step S14, a layout pattern including a DT MOS transistor that satisfies the maximum allowable gate width $W_{MAX}$ is generated to design a semiconductor device.

Thus, the semiconductor device designing method of the second preferred embodiment uses the expression $\{(R\cdot C)/t_{pd}<1\}$ for designing the device. Therefore, a designer may constantly obtain the semiconductor device which ensures a stable operation for a required signal propagation delay time, based on only objective recognition rather than trial and error. That is, the method of the second preferred embodiment is effective in that the use of the expression $\{(R\cdot C)/t_{pd}<1\}$ allows the precise recognition of the maximum allowable gate width $W_{MAX}$ which permits the device to operate in a stable manner when a predetermined signal propagation delay time is provided.

In this manner, the DT MOS transistor having the SOI structure of the second preferred embodiment is designed so that the gate width W, the gate oxide film thickness $t_{OX}$, and the SOI layer thickness $t_{SOI}$ satisfy Expression (6) (Expression (7)) for body potential fixing, providing an operation-stabilized semiconductor device which precludes variations in operating speed also during the high-speed operation.

Although the gate width W is used as the parameter whose final allowable value (maximum allowable gate width $W_{MAX}$) is determined in the flowchart shown in FIG. 7, the allowable value of any parameter which satisfies $\{R\cdot C\cdot f<1\}$ may be determined. Additionally, the technique of the second preferred embodiment is, of course, applicable to the allowable values of a combination of two or more parameters.

Setting the maximum gate width W which satisfies Expression (6) provides the DT MOS transistor having the SOI structure that operates at a maximum speed which allows the stable operation at a high operating speed at which the signal propagation delay time $t_{pd}$ of not greater than 50 ps is required.

The second preferred embodiment is similar to the first preferred embodiment in that the layout pattern generating device shown in FIG. 5 is capable of automatically generating the layout pattern data D3. In the second preferred embodiment, the setting parameters D2 means the signal propagation delay time $t_{pd}$, and the parameters other than the gate width W, such as the gate oxide film thickness $t_{OX}$ and the SOI layer thickness $t_{SOI}$.

In the second preferred embodiment, the layout pattern generating program recorded on the recording medium 101 contains the steps, similar to the steps S11 and S12 of FIG. 6, of providing the signal propagation delay time $t_{pd}$ to be set and the parameters other than the gate width W, and the same steps as the steps S13 and S14 of FIG. 7.

Thus, the layout pattern generating device 100 is capable of automatically generating the layout pattern data D3 including a DT MOS transistor which satisfies the expression $\{(R\cdot C)/t_{pd}<1\}$ based on the provided circuit data D1 and setting parameters D2.

Third Preferred Embodiment

The first and second preferred embodiments illustrate the restrictive conditions of the gate width W, gate oxide film thickness $t_{OX}$ and SOI layer thickness $t_{SOI}$ of the (DT) MOS transistor having the SOI structure which achieves the stable operation by fixing the body potential. Third to tenth preferred embodiments to be described below are intended for improvements in other parameters in Expression (3) or (6) and addition of structural ingenuity for setting of a greater gate width W.

Figure 8:
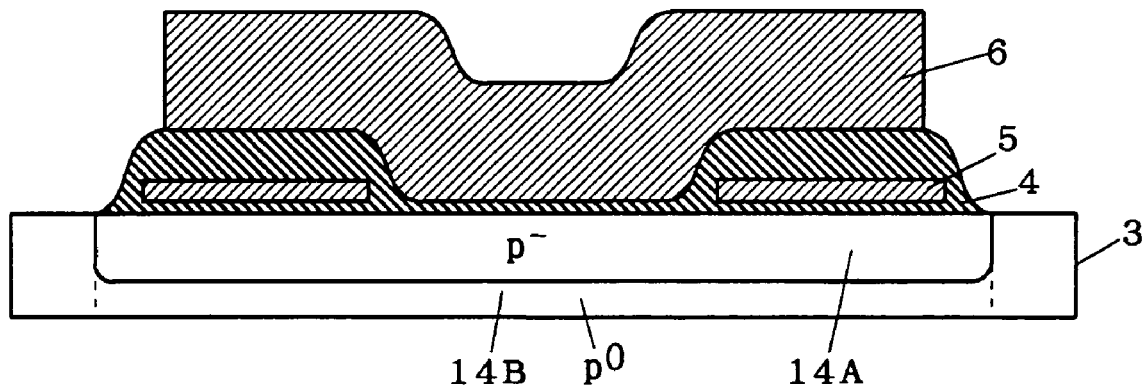
FIG. 8 is a cross-sectional view of a structure of a third preferred embodiment according to the present invention.
Figure 9:
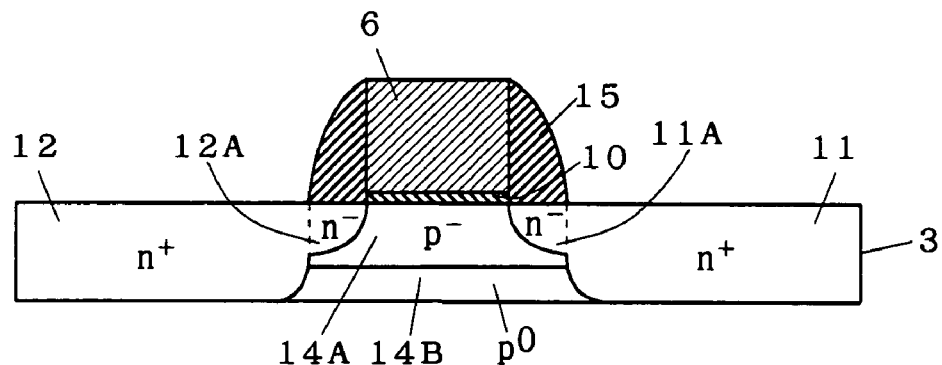
FIG. 9 is a cross-sectional view of another structure of the third preferred embodiment.

FIGS. 8 and 9 are cross-sectional views of the MOS transistor having the SOI structure according to the third preferred embodiment of the present invention. The cross section of FIG. 8 corresponds to that taken along the line A—A of FIG. 1, and the cross section of FIG. 9 corresponds to that taken along the line B—B of FIG. 1.

Referring to FIG. 9, the drain region 11 and the source region 12 are selectively formed so as to extend vertically through the SOI layer 3. The gate oxide film 10 is formed on part of the SOI layer 3 which lies between the drain region 11 and the source region 12, and the gate electrode 6 is formed on the gate oxide film 10. Sidewalls 15 are formed on side surfaces of the gate electrode 6.

The drain region 11 includes a partial drain region 11A positioned under one of the sidewalls 15 and formed in an upper part of the SOI layer 3. The partial drain region 11A is of a low N-type impurity concentration (N⁻), and the remainder of the drain region 11 is of a high N-type impurity concentration (N⁺). Likewise, the source region 12 includes a partial source region 12A positioned under the other sidewall 15 and formed in an upper part of the SOI layer 3. The partial source region 12A is of a low N-type impurity concentration (N⁻), and the remainder of the source region 12 is of a high N-type impurity concentration (N⁺).

In the SOI layer 3 under the gate electrode 6, a body region 14A formed in an upper part thereof is of a low P-type impurity concentration (P⁻), and a body portion 14B formed in a lower part thereof is of a P-type impurity concentration (P⁰) higher than that of the body region 14A.

In this manner, the impurity concentration of the body region 14B positioned under the sidewall 15 and formed in the lower part of the SOI layer 3 is higher than that of the body region 14A (the impurity concentration used for the typical body region 14). This decreases the resistivity ρ of the body portion 13 in Expression (2).

Figure 10:
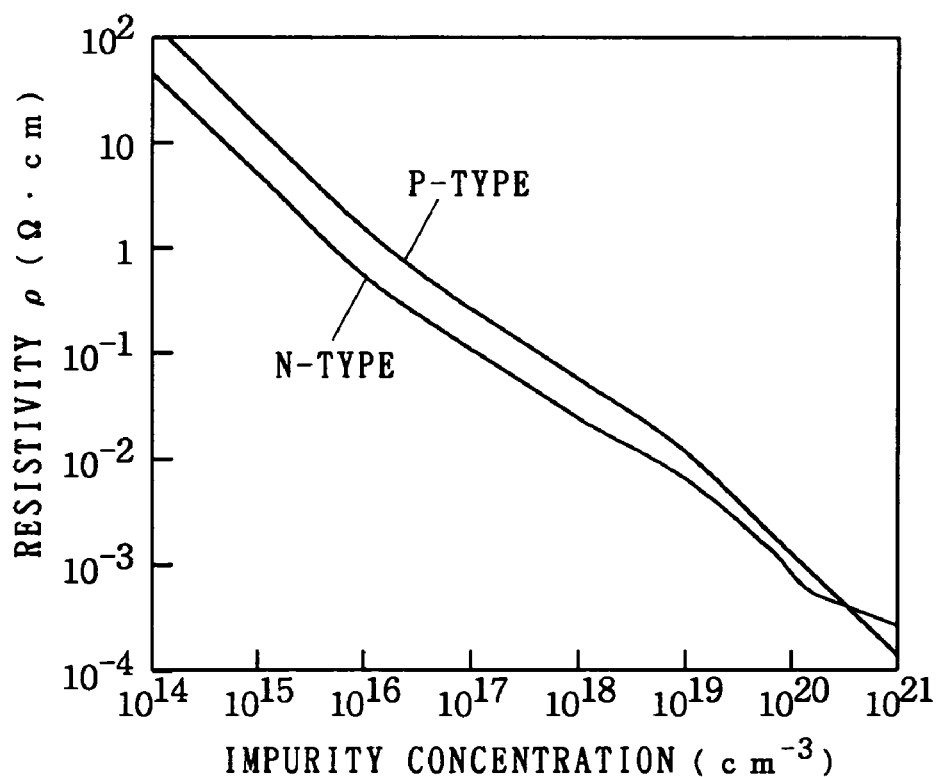
FIG. 10 is a graph showing the relationship between an impurity concentration and a resistivity.

The graph of FIG. 10 shows that the resistivity of the body region 14B is one-tenth that of the body region 14A if the impurity concentration of the body region 14B is ten times that of the body region 14A. The resistivity of the body portion 13 is determined by the resistivity $\rho_{p0}$ of the body region 14B since the resistivity of the body region 14A is negligible. In this case, the SOI layer thickness $t_{SOI}$ must be replaced with the film thickness $t_{p0}$ of the body region 14B.

Thus, Expression (5) in the first preferred embodiment may be transformed into $$\frac{W^2}{t_{OX} \cdot T_{p0}} < \frac{1}{\rho_{p0} \cdot K_0 \cdot \varepsilon_0 \cdot f} \qquad (8)$$

For example, if the body region 14B has the resistivity $\rho_{p0}$ of 0.008 (Ω·cm) and the thickness $t_{p0}$ of 0.02 (μm) and other parameters are similar to those of the first preferred embodiment, that is, $K_0$=3.9, $\varepsilon_0$=8.86×10⁻¹⁴ (F/cm), f=10 (GHz) and the gate oxide film thickness $t_{OX}$=0.007 (μm), then the restrictive condition (v) that {W²<5.0}, or {W<2.23 (μm)}, should be satisfied.

A comparison made between the restrictive conditions (i) and (v) shows that the maximum achievable gate width W of the third preferred embodiment is about 1.4 times greater than that of the first preferred embodiment.

The film thickness $t_{CH}$ of the body region 14A (the depth at which the surface of the body region 14B is formed), if greater than a maximum depletion layer width $X_{dmax}$ determined by the channel concentration of the MOS transistor (the concentration of the body region 14A), exerts no influences upon the current characteristics of the MOS transistor.

Therefore, the body region 14A is required to satisfy $t_{CH}>X_{dmax}$. The maximum depletion layer width $X_{dmax}$ is determined by $$X_{dmax} = \sqrt{\frac{2 \cdot K_S \cdot \varepsilon_0 \cdot \phi_S(inv)}{qN_A}} \qquad (9)$$

where $K_S$ is the relative dielectric constant of silicon, $N_A$ is the impurity concentration of the body region 14A, and $\phi_S(inv)$ is the energy potential during channel formation.

The application of the structure of the third preferred embodiment to the DT MOS structure of the second preferred embodiment permits Expression (7) of the second preferred embodiment to be transformed into $$\frac{W^2}{t_{OX} \cdot t_{p0}} < \frac{t_{pd}}{\rho_{p0} \cdot K_0 \cdot \varepsilon_0} \qquad (10)$$

thereby increasing the maximum achievable gate width W, similar to the application thereof to the first preferred embodiment.

A method of fabricating the structure of the third preferred embodiment shown in FIGS. 8 and 9 is discussed below. First, prior to the formation of the FS insulating layer 4, the FS electrode 5 and the gate electrode 6, P-type impurities are implanted into a lower part of the SOI layer 3 to form a semiconductor region of the impurity concentration P⁰. Thereafter, the FS insulating layer 4, the FS electrode, the gate electrode 6, the drain region 11, the source region 12 and the sidewalls 15 are formed in an existing manner to provide the structure of the third preferred embodiment.

The semiconductor region of the impurity concentration P⁰ formed in the lower part of the SOI layer 3 during the implantation of the P-type impurities remains only in other than the drain and source regions 11 and 12 when the drain and source regions 11 and 12 extending vertically through the SOI layer 3 are formed. The remaining part of the semiconductor region serves as the body region 14B.

Fourth Preferred Embodiment

Figure 11:
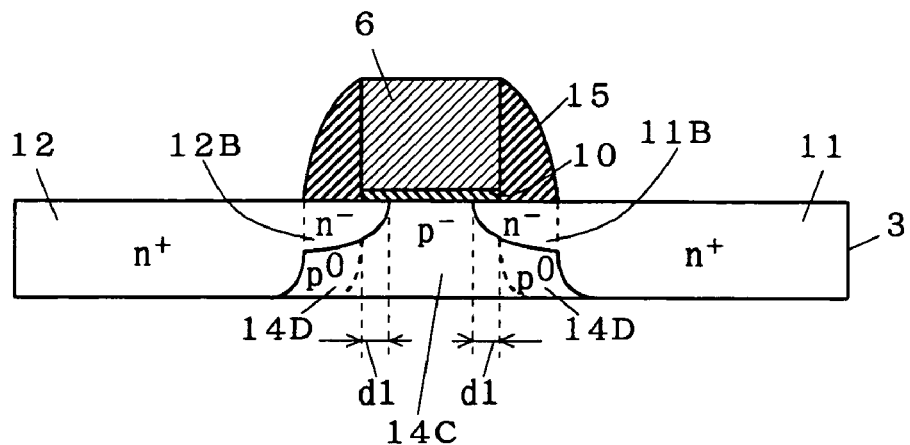
FIG. 11 is a cross-sectional view of a structure of a fourth preferred embodiment according to the present invention.

FIG. 11 is a cross-sectional view of the MOS transistor having the SOI structure according to the fourth preferred embodiment of the present invention. The cross section of FIG. 11 corresponds to that taken along the line B—B of FIG. 1.

Referring to FIG. 11, the sidewalls 15 are formed on the side surfaces of the gate electrode 6. The drain region 11 includes a partial drain region 11B positioned under the entire one sidewall 15 and part of the gate electrode 6 and formed in an upper part of the SOI layer 3. The partial drain region 11B is of a low N-type impurity concentration (N⁻), and the remainder of the drain region 11 is of a high N-type impurity concentration (N⁺). Likewise, the source region 12 includes a partial source region 12B positioned under the entire other sidewall 15 and part of the gate electrode 6 and formed in an upper part of the SOI layer 3. The partial source region 12B is of a low N-type impurity concentration (N⁻), and the remainder of the source region 12 is of a high N-type impurity concentration (N⁺).

The SOI layer 3 under the gate electrode 6 (the sidewalls 15) includes body regions 14D positioned under the sidewalls 15, and a body region 14C positioned under the gate electrode 6. The body region 14C is of a low P-type impurity concentration ($P^-$), and the body regions 14D are of a P-type impurity concentration ($P^0$) higher than that of the body region 14C. Thus, the body regions 14D form all PN junction surfaces with the $N^+$ regions of the drain and source regions 11 and 12.

The partial drain region 11B and the partial source region 12B which are formed also under parts of the gate electrode 6 as well as under the sidewalls 15 accordingly extend a distance dl from the body regions 14D toward the center of the gate electrode 6.

The FS insulating layer 4, the FS electrode 5, the gate electrode 6, and the sidewalls 15 of the fourth preferred embodiment are similar in construction to those of the third preferred embodiment shown in FIGS. 8 and 9.

In this manner, the impurity concentration of the body regions 14D positioned under the sidewalls 15 and formed in lower parts of the SOI layer 3 is higher than that of the body region 14C (the impurity concentration used for the typical body region 14). This decreases the resistivity ρ of the body portion 13 in Expression (2).

Consequently, the structure of the fourth preferred embodiment, similar to the third preferred embodiment, may provide the greater maximum achievable gate width W than that of the first preferred embodiment.

Further, the body regions 14D, which form all of the PN junction surfaces with the $N^+$ regions of the drain and source regions 11 and 12, may prevent a depletion layer from extending from the $N^+$ regions of the drain and source regions 11 and 12, rendering the structure of the fourth preferred embodiment resistant to punch-through.

Additionally, since the partial drain region 11B and the partial source region 12B extend the distance dl from the body regions 14D toward the center of the gate electrode 6, the relatively high impurity concentration $P^0$ of the body regions 14D exerts no adverse effects upon the current characteristics of the MOS transistor during channel formation.

Figure 12:
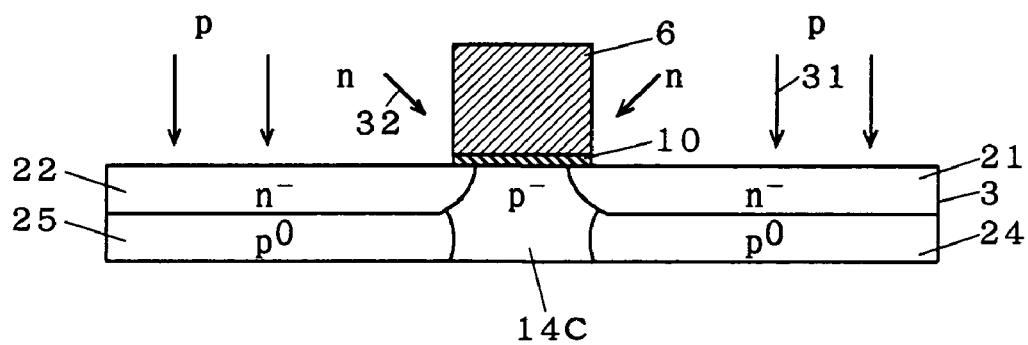
FIG. 12 is a cross-sectional view showing a method of fabrication of the fourth preferred embodiment.

The method of fabricating the structure of the fourth preferred embodiment shown in FIG. 11 is discussed below. First, prior to the formation of the sidewalls 15 after the formation of the gate electrode 6, with the SOI layer 3 of the impurity concentration $P^-$ masked with the gate electrode 6, P-type impurity ions 31 are implanted in the vertical direction (for example, boron ions are implanted at a dose of $5 \times 10^{13}/cm^2$ at an implantation energy of 30 KeV) to form $P^0$-type semiconductor regions 24 and 25, and the oblique-rotating ion implantation of N-type impurity ions 32 is performed to form an $N^-$-type temporary drain region 21 and an $N^-$-type temporary source region 22, as shown in FIG. 12. The temporary drain region 21 and the temporary source region 22, which are formed by the oblique-rotating ion implantation of the N-type impurity ions 32, extend accordingly toward the center of the gate electrode 6 relative to the semiconductor regions 24 and 25.

After the sidewalls 15 are formed, N-type impurities are again implanted using the gate electrode 6 and the sidewalls 15 as a mask to provide the structure shown in FIG. 11.

The semiconductor regions 24 and 25 of the impurity concentration $P^0$ formed in the lower parts of the SOI layer 3 by the implantation of the P-type impurities remain only in other than the drain and source regions 11 and 12 when the drain and source regions 11 and 12 extending vertically through the SOI layer 3 are formed. The remaining parts of the semiconductor regions serve as the body regions 14D.

Fifth Preferred Embodiment

Figure 13:
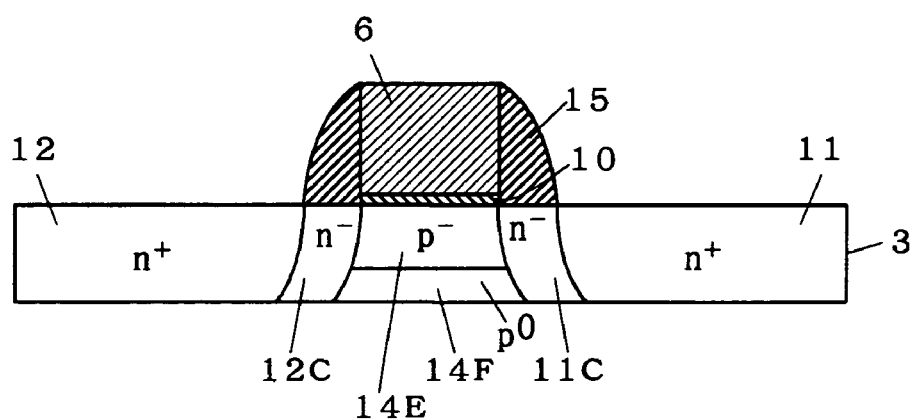
FIG. 13 is a cross-sectional view of a structure of a fifth preferred embodiment according to the present invention.

FIG. 13 is a cross-sectional view of the MOS transistor having the SOI structure according to the fifth preferred embodiment of the present invention. The cross section of FIG. 13 corresponds to that taken along the line B—B of FIG. 1.

With reference to FIG. 13, the sidewalls 15 are formed on the side surfaces of the gate electrode 6. The drain region 11 includes a partial drain region 11C positioned under the one sidewall 15 and extending vertically through the SOI layer 3. The partial drain region 11C is of a low N-type impurity concentration ($N^-$), and the remainder of the drain region 11 is of a high N-type impurity concentration ($N^+$). Likewise, the source region 12 includes a partial source region 12C positioned under the other sidewall 15 and extending vertically through the SOI layer 3. The partial source region 12C is of a low N-type impurity concentration ($N^-$), and the remainder of the source region 12 is of a high N-type impurity concentration ($N^+$).

In the SOI layer 3 under the gate electrode 6, a body region 14E formed in an upper part thereof is of a low P-type impurity concentration ($P^-$), and a body region 14F formed in a lower part thereof is of a P-type impurity concentration ($P^0$) higher than that of the body region 14E.

The FS insulating layer 4, the FS electrode 5, the gate electrode 6, and the sidewalls 15 of the fifth preferred embodiment are similar in construction to those of the third preferred embodiment shown in FIGS. 8 and 9.

In this manner, the impurity concentration of the body region 14F positioned under the gate electrode 6 and formed in the lower part of the SOI layer 3 is higher than that of the body region 14E formed in the upper part thereof. This decreases the resistivity ρ of the body portion 13 in Expression (2). Consequently, the structure of the fifth preferred embodiment may provide the greater maximum achievable gate width W than that of the first preferred embodiment.

Further, since the partial drain region 11C and the partial source region 12C extend vertically through the SOI layer 3, the $N^+$ regions of the drain and source regions 11 and 12 and the $P^0$ body region 14F form no PN junction surfaces. This suppresses junction leakage.

The method of fabricating the structure of the fifth preferred embodiment shown in FIG. 13 is discussed below. First, prior to the formation of the gate electrode 6, P-type impurities are implanted into the lower part of the SOI layer 3 to form a semiconductor region of the impurity concentration $P^0$.

Prior to the formation of the sidewalls 15 after the formation of the gate electrode 6, with the SOI layer 3 of the impurity concentration $P^-$ masked with the gate electrode 6, the oblique-rotating ion implantation of N-type impurities is performed to form an $N^-$-type temporary drain region and an $N^-$-type temporary source region. In this implantation process, a greater implantation energy than that used for the fabrication of the fourth preferred embodiment is used to cause the temporary drain region and the temporary source region to extend vertically through the SOI layer 3, and the oblique-rotating direction in which the N-type impurity ions are implanted is changed to a direction closer to the vertical direction than that used for the fabrication of the fourth preferred embodiment.

The semiconductor region of the impurity concentration $P^0$ formed in the lower part of the SOI layer 3 during the implantation of the P-type impurities remains only in other than the temporary drain region and the temporary source region. The remaining part of the semiconductor region serves as the body region 14F.

After the sidewalls 15 are formed, N-type impurities are again implanted using the gate electrode 6 and the sidewalls 15 as a mask to provide the structure shown in FIG. 13.

Sixth Preferred Embodiment

Figure 14:
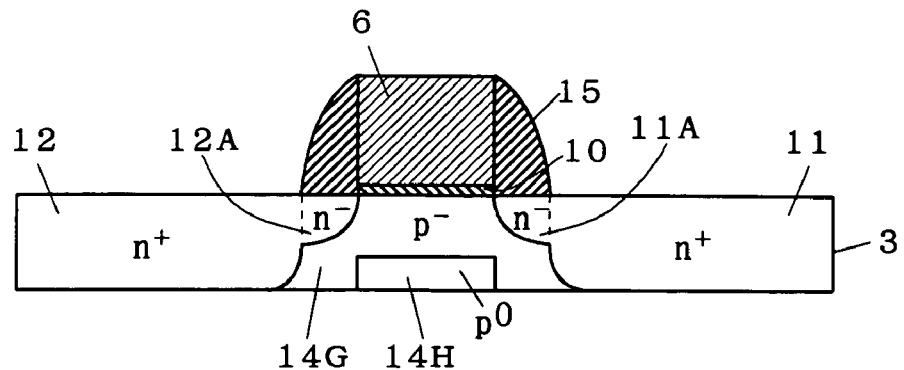
FIG. 14 is a cross-sectional view of a structure of a sixth preferred embodiment according to the present invention.

FIG. 14 is a cross-sectional view of the MOS transistor having the SOI structure according to the sixth preferred embodiment of the present invention. The cross section of FIG. 14 corresponds to that taken along the line B—B of FIG. 1.

With reference to FIG. 14, the sidewalls 15 are formed on the side surfaces of the gate electrode 6. The drain region 11 includes the partial drain region 11A positioned under the one sidewall 15 and formed in an upper part of the SOI layer 3. The partial drain region 11A is of a low N-type impurity concentration (N⁻), and the remainder of the drain region 11 is of a high N-type impurity concentration (N⁺). Likewise, the source region 12 includes the partial source region 12A positioned under the other sidewall 15 and formed in an upper part of the SOI layer 3. The partial source region 12A is of a low N-type impurity concentration (N⁻), and the remainder of the source region 12 is of a high N-type impurity concentration (N⁺).

The SOI layer 3 under the gate electrode 6 (the sidewalls 15) includes a body region 14H positioned immediately under the gate electrode 6 and formed in a lower part of the SOI layer 3, and a body region 14G formed in other than the body region 14H. The body region 14G is of a low P-type impurity concentration (P⁻), and the body region 14H is of a P-type impurity concentration (P⁰) higher than that of the body region 14G.

The FS insulating layer 4, the FS electrode 5, the gate electrode 6, and the sidewalls 15 of the sixth preferred embodiment are similar in construction to those of the third preferred embodiment shown in FIGS. 8 and 9.

In this manner, the impurity concentration of the body region 14H positioned immediately under the gate electrode 6 and formed in the lower part of the SOI layer 3 is higher than that of the body region 14G. This decreases the resistivity ρ of the body portion 13 in Expression (2). Consequently, the structure of the sixth preferred embodiment may provide the greater maximum achievable gate width W than that of the first preferred embodiment.

Further, since the P⁰-type body region 14H is formed only in the lower part of the SOI layer 3 immediately under the gate electrode 6, the N⁺ regions of the drain and source regions 11 and 12 and the P⁰ body region 14H form no PN junction surfaces. This suppresses junction leakage.

Figure 15:
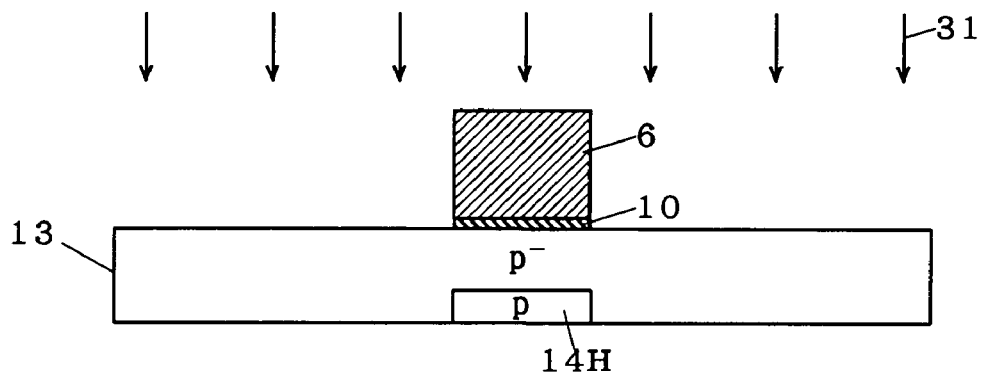
FIG. 15 is a cross-sectional view showing the method of fabrication of the sixth preferred embodiment.

The method of fabricating the structure of the sixth preferred embodiment shown in FIG. 14 is discussed below. First, prior to the formation of the sidewalls 15 after the formation of the gate electrode 6, the P-type impurity ions 31 are implanted into the entire top surface, as shown in FIG. 15.

This implantation process is performed so that only some of the implanted P-type impurity ions which pass through the gate electrode 6 stop at the lower part of the body portion 13 but some of the implanted P-type impurity ions which do not pass through the gate electrode 6 are introduced through the SOI layer 3 into a buried oxide film 2 (not shown) under the SOI layer 3. Such implantation may be achieved, for example, by implanting boron ions at a dose of about $1 \times 10^{14}/cm^2$ at an implantation energy of 120 KeV when the SOI layer has a thickness $t_{SOI}$ of 100 nm and the gate electrode 6 has a thickness $t_{gate}$ of 200 nm.

Next, with the SOI layer 3 masked with the gate electrode 6, N-type impurity ions are implanted to form an N⁻-type temporary drain region and an N⁻-type temporary source region.

After the sidewalls 15 are formed, N-type impurities are implanted again using the gate electrode 6 and the sidewalls 15 as a mask to provide the structure shown in FIG. 14.

Seventh Preferred Embodiment

Figure 16:
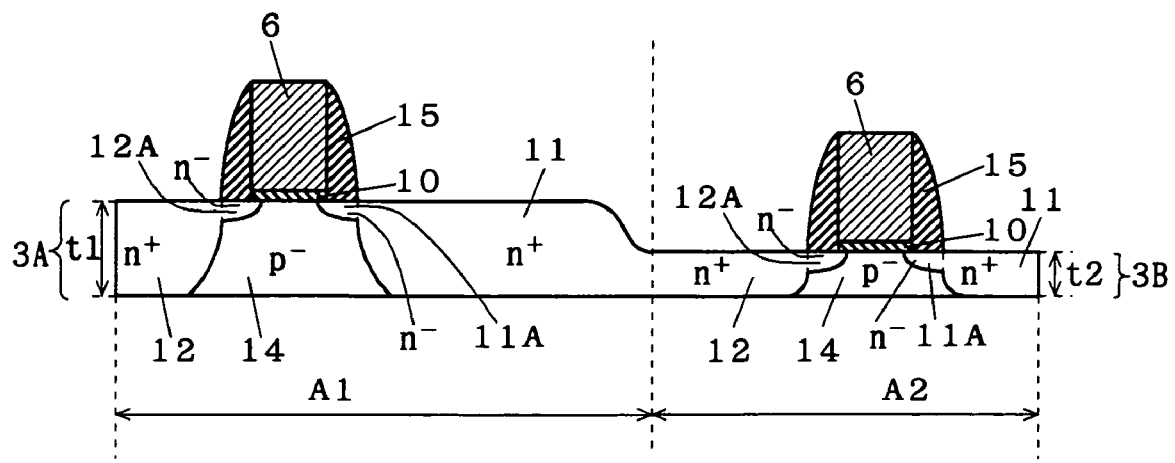
FIG. 16 is a cross-sectional view of a structure of a seventh preferred embodiment according to the present invention.

FIG. 16 is a cross-sectional view of the MOS transistor having the SOI structure according to the seventh preferred embodiment of the present invention. As shown in FIG. 16, a transistor (including a DT MOS transistor) having a fixed body potential is formed in a body-fixed transistor region A1 of an SOI layer 3A having a thickness t1, and a transistor having a floating body is formed in a body-floating transistor region A2 of an SOI layer 3B having a thickness t2 (<t1).

The thickness t1 of the SOI layer 3A is such as to satisfy Expression (4) (or Expression (6)) when $t_{SOI}$=t1 to provide a desired gate width W, and the thickness t2 of the SOI layer 3B is such as to cause the body region 14 to be completely depleted during operation.

In the structure of the seventh preferred embodiment, the SOI MOS transistor formed in the body-fixed transistor region A1 achieves a stable operation when the desired gate width W is provided.

On the other hand, the SOI MOS transistor formed in the body-floating transistor region A2 includes the body region 14 which is completely depleted during operation to provide electrical characteristics with a good S (subthreshold) factor. Therefore, it is effective to form a circuit which may employ a MOS transistor that is unstable in operating speeds without problems in the body-floating transistor region A2 since electrical characteristics of a good S factor is accordingly provided.

Eighth Preferred Embodiment

Figure 17:
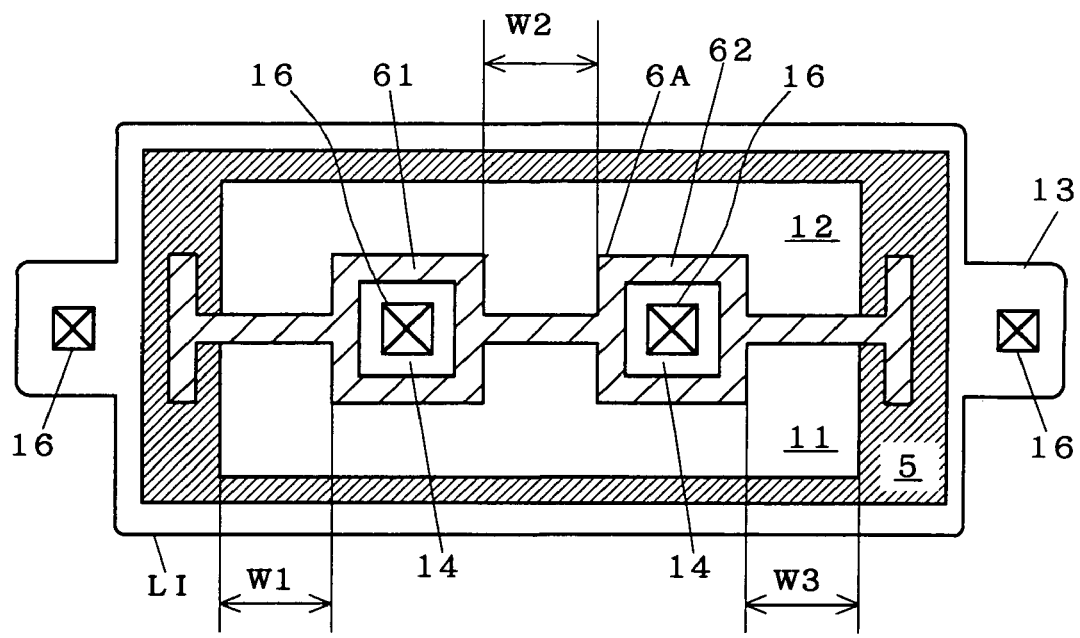
FIG. 17 is a plan view of a structure of an eighth preferred embodiment according to the present invention.

FIG. 17 is a plan view of the MOS transistor having the SOI structure according to the eighth preferred embodiment of the present invention.

With reference to FIG. 17, the FS electrode 5 surrounds the drain region 11 and the source region 12 as seen in plan view, and a gate electrode 6A is formed between the drain region 11 and the source region 12 and partially on the FS electrode 5.

The gate electrode 6A includes two frame portions 61 and 62 formed on a region between the drain region 11 and the source region 12. Each of the frame portions 61 and 62 has an opening which exposes the body region 14. A body contact 16 is provided on the body region 14 in each of the frame portions 61 and 62. In FIG. 17, the distance between the FS electrode 5 and the frame portion 61 along the gate width W is denoted as W1, the distance between the frame portions 61 and 62 as W2, and the distance between the FS electrode 5 and the frame portion 62 as W3.

A pair of body contacts 16 are also formed in the body portion 13 on the outer periphery of the FS electrode 5 so as to be positioned on outward extension lines (not shown) from the opposite ends of the gate electrode 6A. The pair of body contacts 16 are opposed, as seen in plan view, to the drain and source regions 11 and 12, with the FS electrode 5 therebetween. The outermost peripheral edge L1 of FIG. 17 serves as the boundary of the isolation of the SOI layer by the LOCOS process and the like.

The structure of the eighth preferred embodiment in cross section taken in the longitudinal direction of the gate electrode 6A is similar to the cross section of the structure of the first preferred embodiment shown in FIG. 1. The structure of the eighth preferred embodiment in cross section taken in the direction in which the drain region 11 and the source region 12 are arranged is similar to the structures shown in FIGS. 9, 11, 13, 14 and 21. Either the body fixed potential MOS transistor shown in the first preferred embodiment or the DT MOS transistor shown in the second preferred embodiment may be used as the MOS transistor of the eighth preferred embodiment.

In the MOS transistor of the eighth preferred embodiment having such a plan structure, since the body contacts 16 are provided within the frame portions 61 and 62 of the gate electrode 6A, the fixed potential transmission path in the body region 14 is divided into three. The stable operation of the MOS transistor is achieved if each of the gate widths W1, W2 and W3 of the three divisions of the body region 14 satisfies Expression (4) or Expression (6).

Consequently, the substantial gate width of the MOS transistor comprising the drain region 11, the source region 12, and the gate electrode 6A may be set to (W1+W2+W3). This provides the MOS transistor which is stable in operation and sufficiently great in gate width.

Ninth Preferred Embodiment

Figure 18:
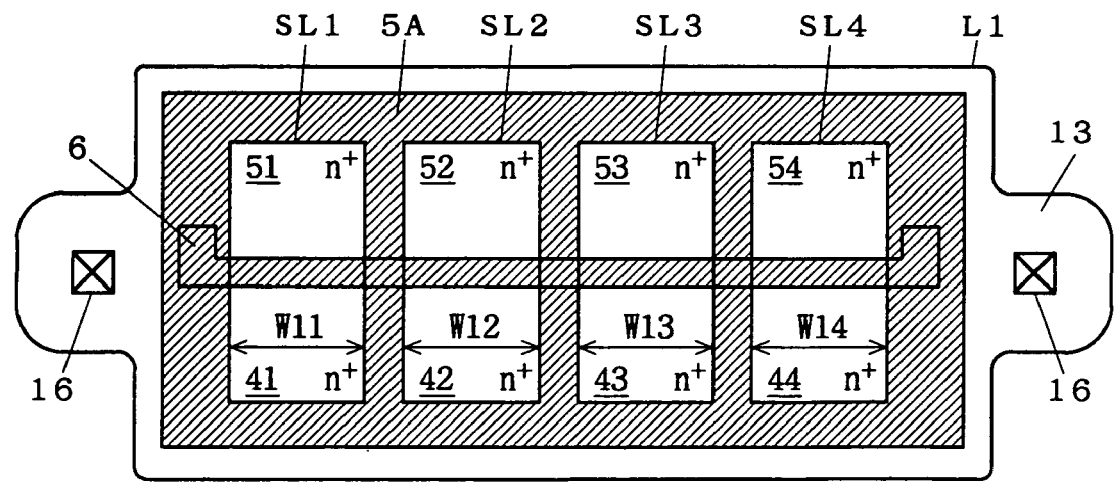
FIG. 18 is a plan view of a structure of a ninth preferred embodiment according to the present invention.

FIG. 18 is a plan view of the MOS transistor having the SOI structure according to the ninth preferred embodiment of the present invention.

With reference to FIG. 18, an FS electrode 5A has four slits SL1 to SL4 in which drain regions 41 to 44 and source regions 51 to 54 are formed respectively. The body portion 13 is formed under the FS electrode 5A. The gate electrode 6 is formed between the drain regions 41 to 44 and the source regions 51 to 54 and partially on the FS electrode 5A.

As in the eighth preferred embodiment, the pair of body contacts 16 are formed in the body portion 13 on the outer periphery of the FS electrode 5A so as to be positioned on outward extension lines (not shown) from the opposite ends of the gate electrode 6. The outermost peripheral edge L1 of FIG. 18 serves as the boundary of the isolation of the SOI layer by the LOCOS process and the like.

The structure of the ninth preferred embodiment in cross section taken in the longitudinal direction of the gate electrode 6 is similar to the cross section of the structure of the first preferred embodiment shown in FIG. 1. The structure of the ninth preferred embodiment in cross section taken in the direction in which the drain regions 41 to 44 and the source regions 51 to 54 are arranged is similar to the structures shown in FIGS. 9, 11, 13, 14 and 21. Either the body fixed potential MOS transistor shown in the first preferred embodiment or the DT MOS transistor shown in the second preferred embodiment may be used as the MOS transistor of the ninth preferred embodiment.

In the MOS transistor of the ninth preferred embodiment having such a plan structure, the body portion 13 is formed under parts of the FS electrode 5A which serve as the boundaries between the slits SL1 to SL4 of the FS electrode 5A, to ensure the fixed potential transmission path having a sufficiently lower resistance than that of the body region 14 under the gate electrode 6. The fixed potential transmission path in the body region 14 is divided into four. The stable operation of the MOS transistor is achieved if each gate width W11, W12, W13, and W14 satisfies Expression (4) or Expression (6).

Consequently, the substantial gate width of the MOS transistor comprising the drain regions 41 to 44, the source regions 51 to 54, and the gate electrode 6 may be set to (W11+W12+W13+W14). This provides the MOS transistor which is stable in operation and sufficiently great in gate width.

Tenth Preferred Embodiment

Figure 19:
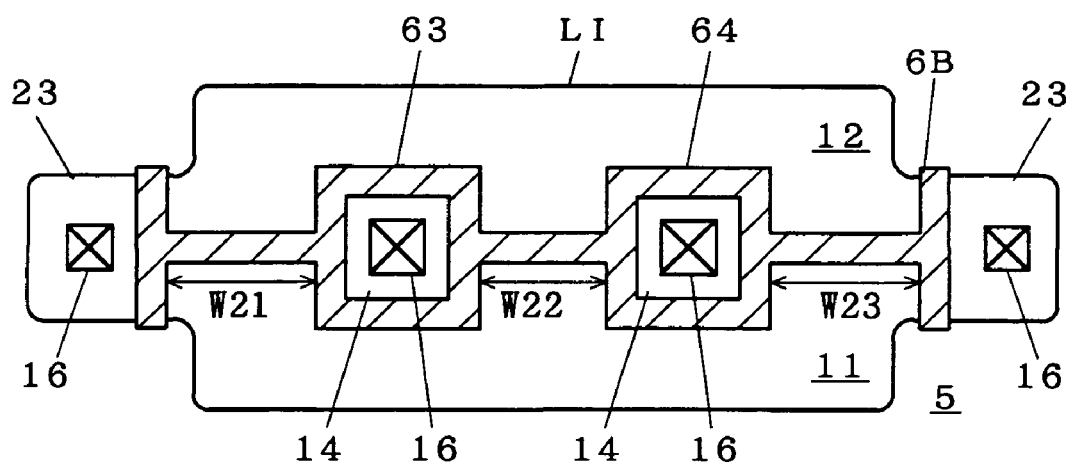
FIG. 19 is a plan view of a structure of a tenth preferred embodiment according to the present invention.
Figure 20:
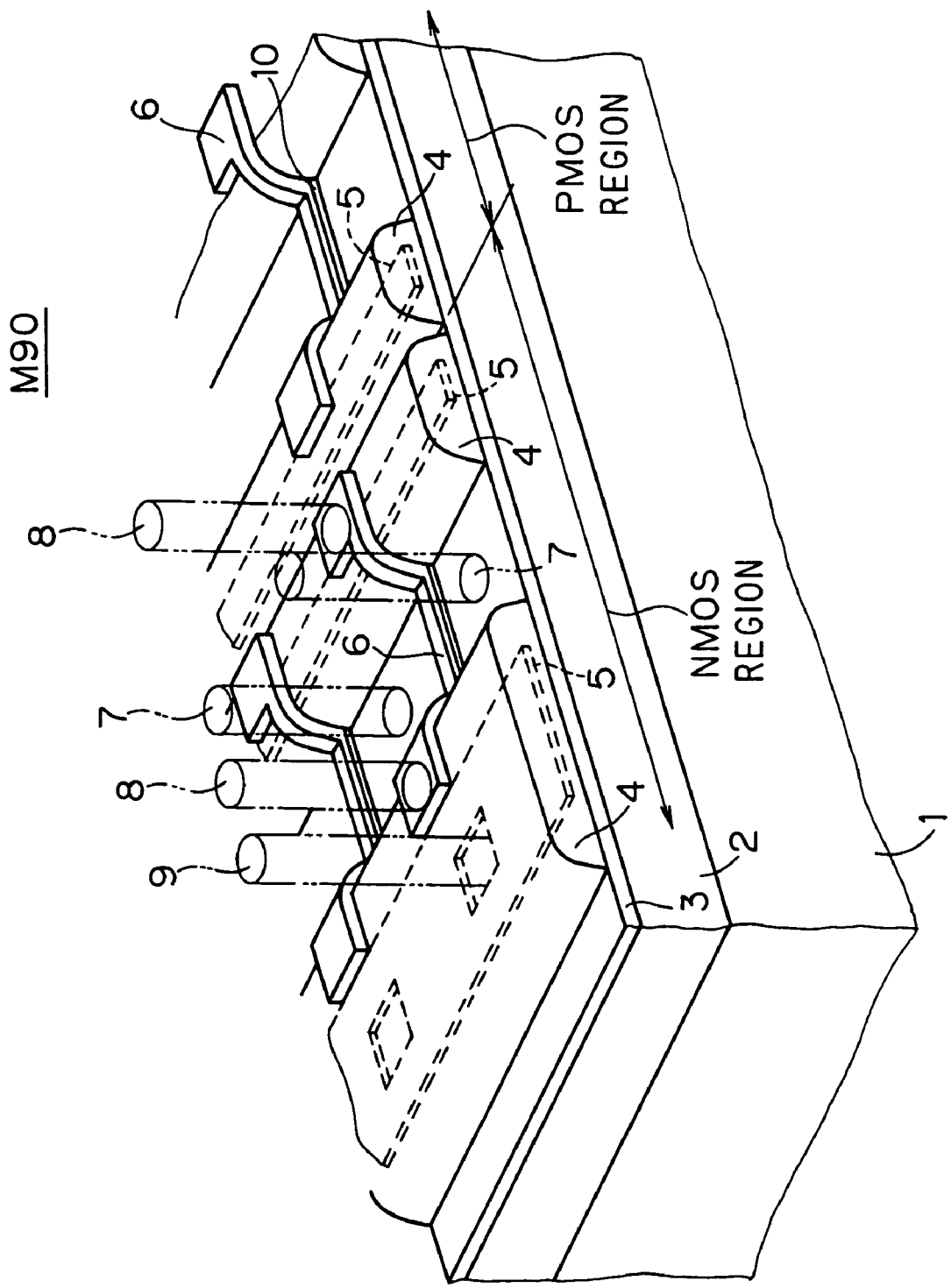
FIG. 20 is a perspective view showing the general construction of a semiconductor device having a field isolation structure.
Figure 21:
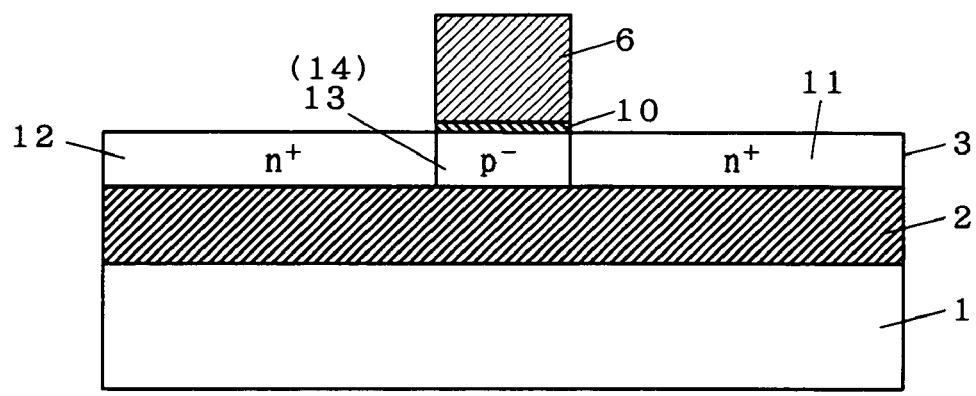
FIG. 21 is a cross-sectional view of an SOI MOS transistor.
Figure 22:
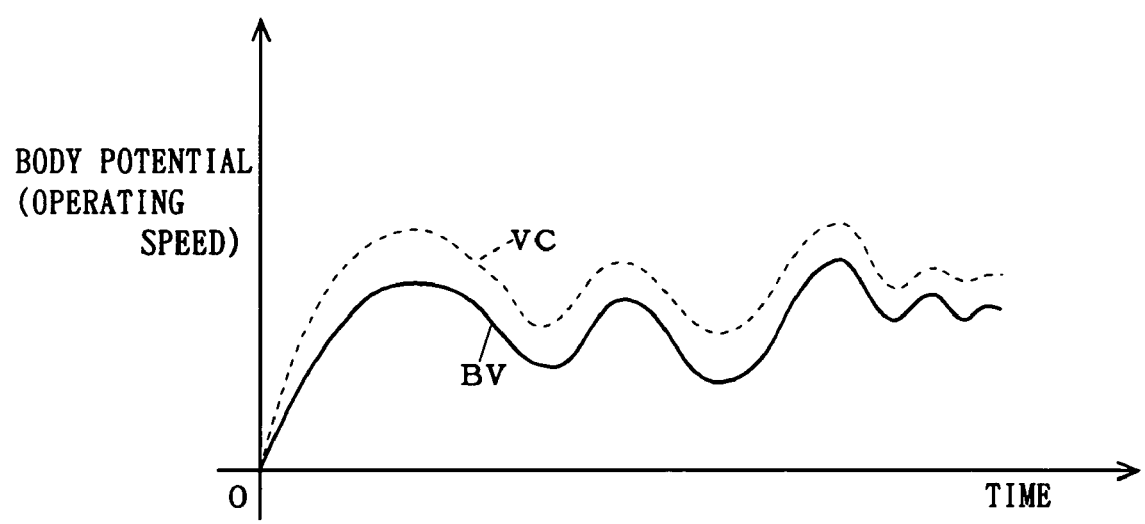
FIG. 22 is a graph illustrating a problem with a conventional SOI MOS transistor.
Figure 23:
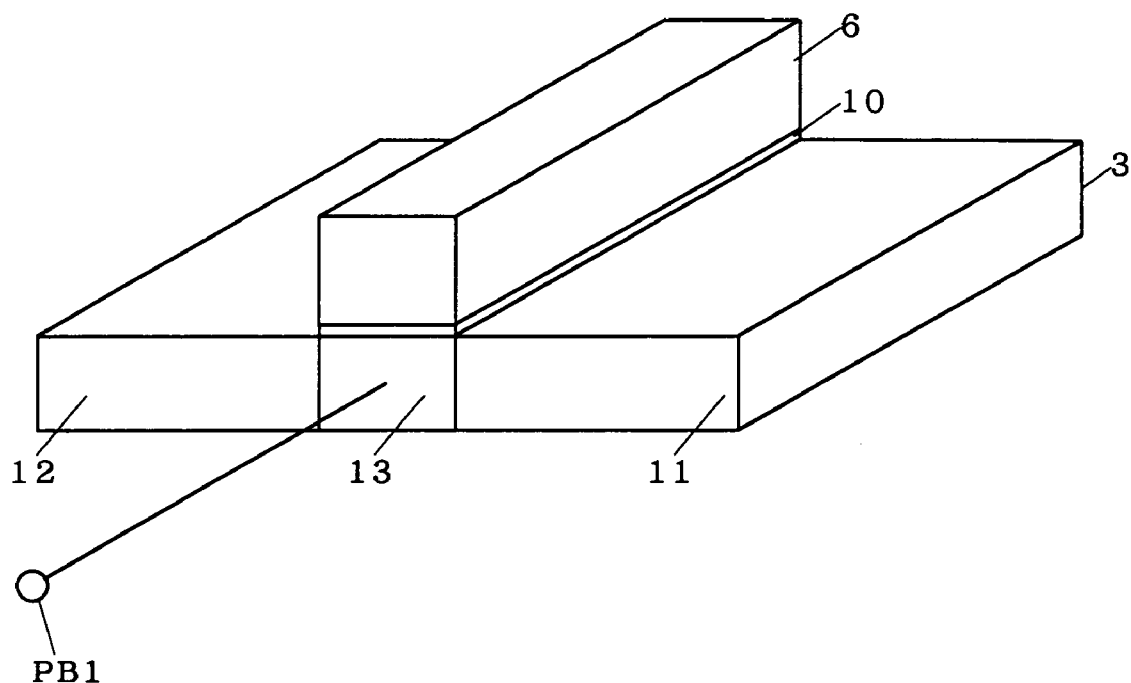
FIG. 23 is a schematic view of a body potential fixed MOS transistor.
Figure 24:
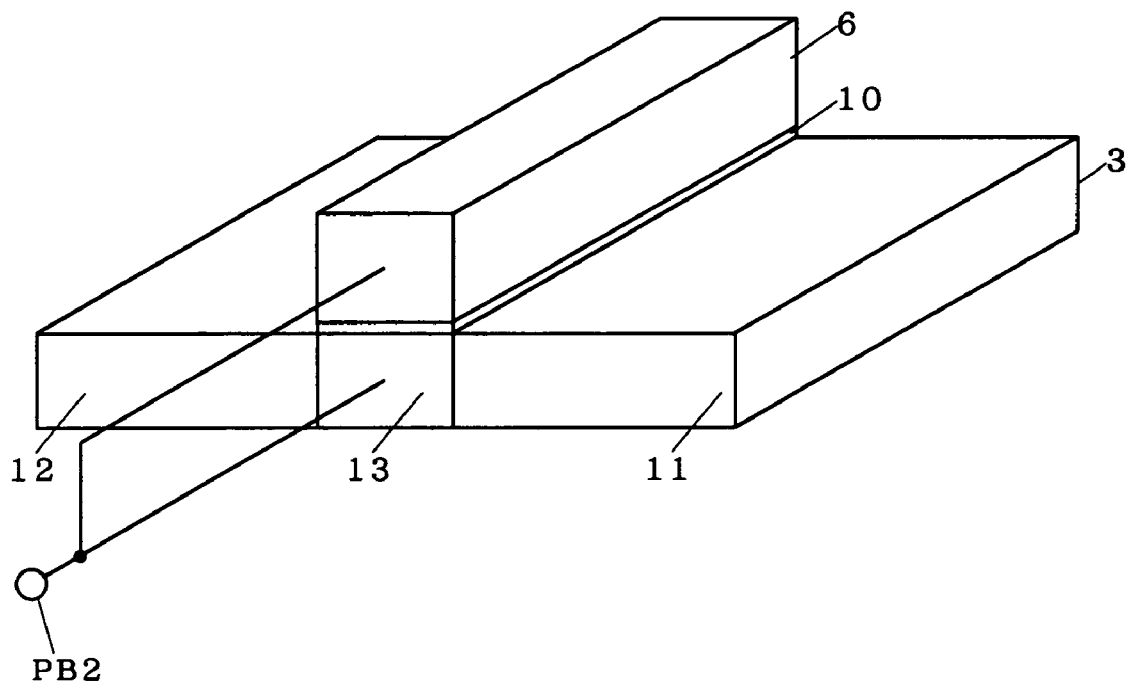
FIG. 24 is a schematic view of a DT MOS transistor.

FIG. 19 is a plan view of the MOS transistor having the SOI structure according to the tenth preferred embodiment of the present invention.

With reference to FIG. 19, a gate electrode 6B is formed between the drain region 11 and the source region 12 and partially on the body portion 13. The gate electrode 6B includes two frame portions 63 and 64 formed on a region between the drain region 11 and the source region 12. A body contact 16 is provided on the body region 14 exposed by an opening of each of the frame portions 63 and 64. In FIG. 19, the distance between a boundary of the gate electrode 6B and the frame portion 63 along the gate width W of the gate electrode 6B is denoted as W21, the distance between the frame portions 63 and 64 as W22, and the distance between another boundary of the gate electrode 6B and the frame portion 64 as W23.

As in the eighth and ninth preferred embodiments, a pair of body contacts 16 are also formed in the body portion 13 so as to be positioned on outward extension lines (not shown) from the opposite ends of the gate electrode 6B. The outermost peripheral edge L1 of FIG. 19 serves as the boundary of the isolation of the SOI layer by the LOCOS process and the like.

The structure of the tenth preferred embodiment in cross section taken in the direction in which the drain region 11 and the source region 12 are arranged is similar to the structures shown in FIGS. 9, 11, 13, 14 and 21. Either the body fixed potential MOS transistor shown in the first preferred embodiment or the DT MOS transistor shown in the second preferred embodiment may be used as the MOS transistor of the tenth preferred embodiment.

In the MOS transistor of the tenth preferred embodiment having such a plan structure, leftmost and rightmost I-shaped stem parts of the gate electrode 6B which extend in the direction in which the drain region 11 and the source region 12 are arranged as shown in FIG. 19, similar to the opposed I-shaped stem parts of the H-shaped gate, may provide electrical insulation between the body portion 13 (the body region 14) and the drain and source regions 11 and 12.

In the MOS transistor of the tenth preferred embodiment, since the body contacts 16 are provided within the frame portions 63 and 64 of the gate electrode 6B, the fixed potential transmission path in the body region 14 is divided into three, as in the eighth preferred embodiment. The stable operation of the MOS transistor is achieved if each of the gate widths W21, W22 and W23 satisfies Expression (4) or Expression (6).

Consequently, the substantial gate width of the MOS transistor comprising the drain region 11, the source region 12, and the gate electrode 6B may be set to (W21+W22+W23). This provides the MOS transistor which is stable in operation and sufficiently great in gate width.

Additionally, the absence of the FS electrode may accordingly reduce the area of the body portion 13 to be formed.

A DT MOS transistor having the structure of the tenth preferred embodiment achieves a higher operating speed.

<Modifications>

The MOS transistor of the above-mentioned preferred embodiments may be used to constitute a gate array to the extent that the gate width W of each of the preferred embodiments satisfies the predetermined restrictive conditions. Further, although the NMOS transistor is used as an example in the above-mentioned preferred embodiments, the present invention is, of course, applicable to a PMOS transistor.

While the invention has been described in detail, the foregoing description is in all aspects illustrative and not restrictive. It is understood that numerous other modifications and variations can be devised without departing from the scope of the invention.

We claim:

1. A method of designing a semiconductor device including a MOS transistor formed on an SOI substrate including a supporting substrate, a buried oxide film and an SOI layer, said MOS transistor being operated based on a predetermined clock, said MOS transistor comprising:
a first semiconductor region of a first conductivity type and selectively formed in said SOI layer;
a second semiconductor region of said first conductivity type and selectively formed in said SOI layer independently of said first semiconductor region;
a body portion of a second conductivity type and including a body region, said body region being a region of said SOI layer which lies between said first and second semiconductor regions;
a gate electrode formed on a gate oxide film formed on said body region; and
at least one body contact electrically connected to said body portion and receiving a fixed potential,
said method comprising the steps of:
(a) providing an operating frequency of said predetermined clock; and
(b) determining a layout pattern of said MOS transistor based on the operating frequency of said predetermined clock,
wherein the layout pattern of said MOS transistor is determined in said step (b) so as to satisfy the conditional expression $$R \cdot C \cdot f < 1$$

where
C=the gate capacitance (F) of said MOS transistor,
R=the resistance of a fixed potential transmission path extending from said at least one body contact to said body region,
f=the operating frequency of said predetermined clock, and
$f \geq 500$ MHz.

2. A method of designing a semiconductor device including a MOS transistor formed on an SOI substrate including a supporting substrate, a buried oxide film and an SOI layer, said MOS transistor comprising:
a first semiconductor region of a first conductivity type and selectively formed in said SOI layer;
a second semiconductor region of said first conductivity type and selectively formed in said SOI layer independently of said first semiconductor region;
a body portion of a second conductivity type and including a body region, said body region being a region of said SOI layer which lies between said first and second semiconductor regions;
a gate electrode formed on a gate oxide film formed on said body region, said gate electrode being electrically connected to said body portion; and
at least one body contact electrically connected to said body portion and receiving a fixed potential,
said method comprising the steps of:
(a) providing a signal propagation delay time required for said MOS transistor; and
(b) determining a layout pattern of said MOS transistor based on said signal propagation delay time,
wherein the layout pattern of said MOS transistor is determined in said step (b) so as to satisfy the conditional expression $$(R \cdot C)/td < 1$$

where
C=the gate capacitance of said MOS transistor,
R=the resistance of a fixed potential transmission path extending from said at least one body contact to said body region,
td=signal propagation delay time required for said MOS transistor, and
$td \leq 50$ ps.

3. A semiconductor device designed by the method as recited in claim 1.

4. A semiconductor device designed by the method as recited in claim 2.

5. The semiconductor device according to claim 3, wherein said resistance R of said fixed potential transmission path is determined by $$R = (\rho \cdot W)/(L \cdot t_{SOI})$$

where
W=the length of said fixed potential transmission path in said body region along the gate width of said gate electrode,
L=the length of said fixed potential transmission path in said body region along the gate length of said gate electrode,
$t_{SOI}$=the thickness of said SOI layer, and
$\rho$=the resistivity of said body region.

6. A semiconductor device including an MOS transistor formed on an SOI substrate including a supporting substrate, a buried oxide film and an SOI layer, said MOS transistor being operated based on a predetermined clock, said MOS transistor comprising:
a first semiconductor region of a first conductivity type and selectively formed in said SOI layer;
a second semiconductor region of said first conductivity type and selectively formed in said SOI layer independently of said first semiconductor region;
a body portion of a second conductivity type and including a body region, said body region being a region of said SOI layer which lies between said first and second semiconductor regions;
a gate electrode formed on a gate oxide film formed on said body region; and
at least one body contact electrically connected to said body portion and receiving a fixed potential,
said MOS transistor being formed by a method comprising the steps of:
(a) providing an operating frequency of said predetermined clock; and (b) determining a layout pattern of said MOS transistor based on the operating frequency of said predetermined clock, wherein the layout pattern of said MOS transistor is determined in said step (b) so as to satisfy the conditional expression $R \cdot C \cdot f < 1$ where C=the gate capacitance of said MOS transistor,
R=the resistance of a fixed potential transmission path extending from said at least one body contact to said body region,
f=the operating frequency of said predetermined clock, and
f>500 MHZ, wherein said resistance R of said fixed potential transmission path is determined by $R = (\rho \cdot W)/(L \cdot t_{SOI})$ where W=the length of said fixed potential transmission path in said body region along the gate width of said gate electrode,
L=the length of said fixed potential transmission path in said body region along the gate length of said gate electrode,
$t_{SOI}$=the thickness of said SOI layer, and
$\rho$=the resistivity of said body region, and
wherein said body portion includes a region extending from said body region in abutting relation with at least part of an outer periphery of said first and second semiconductor regions,
said MOS transistor further comprising
an isolation electrode formed on an insulating film formed on part of said body portion which is other than said body region and is in abutting relation with at least part of the outer periphery of said first and second semiconductor regions,
said at least one body contact including an out-of-isolation-electrode body contact formed on a region of said body portion which is opposed, as seen in plan view, to said first and second semiconductor regions with said isolation electrode therebetween.

7. The semiconductor device according to claim 6, wherein said body region includes a body contact definable region wherein said body contact is permitted to be formed,
wherein said gate electrode has an opening that exposes said body contact definable region, and
wherein said at least one body contact further includes an in-gate-electrode body contact formed on said body contact definable region.

8. The semiconductor device according to claim 6, wherein said first semiconductor region includes a plurality of first semiconductor regions, and said second semiconductor region includes a plurality of second semiconductor regions,
wherein said body portion includes a region formed between said plurality of first and second semiconductor regions so as to isolate said plurality of first and second semiconductor regions into discrete relationship, and
wherein said isolation electrode is further formed on said region of said body portion which isolates said plurality of first and second semiconductor regions into discrete relationship.

9. A semiconductor device including an MOS transistor formed on an SOI substrate including a supporting substrate, a buried oxide film and an SOI layer, said MOS transistor being operated based on a predetermined clock,
said MOS transistor comprising:
a first semiconductor region of a first conductivity type and selectively formed in said SOI layer;
a second semiconductor region of said first conductivity type and selectively formed in said SOI layer independently of said first semiconductor region;
a body portion of a second conductivity type and including a body region, said body region being a region of said SOI layer which lies between said first and second semiconductor regions;
a gate electrode formed on a gate oxide film formed on said body region; and
at least one body contact electrically connected to said body portion and receiving a fixed potential,
said MOS transistor being formed by a method comprising the steps of:
(a) providing an operating frequency of said predetermined clock; and
(b) determining a layout pattern of said MOS transistor based on the operating frequency of said predetermined clock,
wherein the layout pattern of said MOS transistor is determined in said step (b) so as to satisfy the conditional expression $R \cdot C \cdot f < 1$ where C=the gate capacitance of said MOS transistor,
R=the resistance of a fixed potential transmission path extending from said at least one body contact to said body region,
f=the operating frequency of said predetermined clock, and
f>500 MHZ wherein said resistance R of said fixed potential transmission path is determined by $R = (\rho \cdot W)/(L \cdot t_{SOI})$ where W=the length of said fixed potential transmission path in said body region along the gate width of said gate electrode,
L=the length of said fixed potential transmission path in said body region along the gate length of said gate electrode,
$t_{SOI}$=the thickness of said SOI layer, and
$\rho$=the resistivity of said body region,
wherein said body portion includes a region disposed in abutting relation with said first and second semiconductor regions along the gate width and extending from said body region along the gate length,
wherein said gate electrode is formed on part of said body portion which is disposed in abutting relation with said first and second semiconductor regions along the gate width, and extends further from on said body region along said gate length, and
wherein said at least one body contact includes an out-of-gate-electrode body contact from on said region of said body portion which is opposed, as seen in plan view, to said first and second semiconductor regions, with said gate electrode therebetween.

10. The semiconductor device according to claim 9,
wherein said body region includes a body contact definable region in which said body contact is permitted to be formed,
wherein said gate electrode has an opening that exposes said body contact definable region, and
wherein said at least one body contact further includes an in-gate-electrode body contact formed on said body contact definable region.

11. A semiconductor device including an MOS transistor formed on an SOI substrate including a supporting substrate, a buried oxide film and an SOI layer, said MOS transistor being operated based on a predetermined clock,
said MOS transistor comprising:
a first semiconductor region of a first conductivity type and selectively formed in said SOI layer;
a second semiconductor region of said first conductivity type and selectively formed in said SOI layer independently of said first semiconductor region;
a body portion of a second conductivity type and including a body region, said body region being a region of said SOI layer which lies between said first and second semiconductor regions;
a gate electrode formed on a gate oxide film formed on said body region; and
at least one body contact electrically connected to said body portion and receiving a fixed potential,
said MOS transistor being formed by a method comprising the steps of:
(a) providing an operating frequency of said predetermined clock; and
(b) determining a layout pattern of said MOS transistor based on the operating frequency of said predetermined clock,
wherein the layout pattern of said MOS transistor is determined in said step (b) so as to satisfy the conditional expression $R \cdot C \cdot f < 1$ where
C=the gate capacitance of said MOS transistor,
R=the resistance of a fixed potential transmission path extending from said at least one body contact to said body region,
f=the operating frequency of said predetermined clock, and
f>500 MHZ,
wherein said resistance R of said fixed potential transmission path is determined by $R = (\rho \cdot W)/(L \cdot t_{SOI})$ where
W=the length of said fixed potential transmission path in said body region along the gate width of said gate electrode,
L=the length of said fixed potential transmission path in said body region along the gate length of said gate electrode,
$t_{SOI}$=the thickness of said SOI layer, and
ρ=the resistivity of said body region, and
wherein said at least one body contact includes:
a first body contact formed on said body portion in a position located on an outward extension line from one end of said gate electrode along the gate width, and
a second body contact formed on said body portion in a position located on an outward extension linen from the other end of said gate electrode along the gate width.

12. A semiconductor device including an MOS transistor formed on an SOI substrate including a supporting substrate, a buried oxide film and an SOI layer, said MOS transistor being operated based on a predetermined clock,
said MOS transistor comprising:
a first semiconductor region of a first conductivity type and selectively formed in said SOI layer;
a second semiconductor region of said first conductivity type and selectively formed in said SOI layer independently of said first semiconductor region;
a body portion of a second conductivity type and including a body region, said body region being a region of said SOI layer which lies between said first and second semiconductor regions;
a gate electrode formed on a gate oxide film formed on said body region; and
at least one body contact electrically connected to said body portion and receiving a fixed potential,
said MOS transistor being formed by a method comprising the steps of:
(a) providing an operating frequency of said predetermined clock; and
(b) determining a layout pattern of said MOS transistor based on the operating frequency of said predetermined clock,
wherein the layout pattern of said MOS transistor is determined in said step (b) so as to satisfy the conditional expression $R \cdot C \cdot f < 1$ where
C=the gate capacitance of said MOS transistor,
R=the resistance of a fixed potential transmission path extending from said at least one body contact to said body region,
f=the operating frequency of said predetermined clock, and
f>500 MHZ,
wherein said resistance R of said fixed potential transmission path is determined by $R = (\rho \cdot W)/(L \cdot t_{SOI})$ where
W=the length of said fixed potential transmission path in said body region along the gate width of said gate electrode,
L=the length of said fixed potential transmission path in said body region along the gate length of said gate electrode,
$t_{SOI}$=the thickness of said SOI layer, and
ρ=the resistivity of said body region, and
wherein said body region includes a first body region at least part of which is formed in an upper part thereof, and a second body region formed in a lower part thereof,
said second body region of the second conductivity type being of an impurity concentration higher than the impurity concentration of said first body region of the second conductivity type.

13. The semiconductor device according to claim 12,
wherein said first semiconductor region includes a first main region and a first partial semiconductor region, and said second semiconductor region includes a second main region and a second partial semiconductor region, said first and second partial semiconductor regions being formed in opposed relation in upper partial regions of said first and second semiconductor regions, said first and second partial semiconductor regions of the first conductivity type being of an impurity concentration lower than the impurity concentration of said first and second main regions of the first conductivity type, wherein said second body region includes first and second partial body regions, wherein said first and second partial body regions are formed under parts of said first and second partial semiconductor regions and in interface contact with said first and second main regions, respectively, said body region in other than said first and second partial body regions being defined as said first body region, and wherein said first body region is formed out of interface contact with said first and second main regions, and said first and second partial semiconductor regions extend a predetermined distance from said first and second partial body regions toward the center of said gate electrode.

14. The semiconductor device according to claim 12, wherein said first semiconductor region includes a first main region and a first partial semiconductor region, and said second semiconductor region includes a second main region and a second partial semiconductor region, said first and second partial semiconductor regions being formed in opposed relation in partial regions of said first and second semiconductor regions and extending vertically through said SOI layer, said first and second partial semiconductor regions of the first conductivity type being of an impurity concentration lower than the impurity concentration of said first and second main regions of the first conductivity type.

15. The semiconductor device according to claim 12, wherein said first semiconductor region includes a first main region and a first partial semiconductor region, and said second semiconductor region includes a second main region and a second partial semiconductor region, said first and second partial semiconductor regions being formed in opposed relation in partial regions of said first and second semiconductor regions, said first and second partial semiconductor regions of the first conductivity type being of an impurity concentration lower than the impurity concentration of said first and second main regions of the first conductivity type, and wherein said second body region is formed in a lower central part of said body region and out of interface contact with said first and second main regions.

16. A semiconductor device including an MOS transistor formed on an SOI substrate including a supporting substrate, a buried oxide film and an SOI layer, said MOS transistor being operated based on a predetermined clock, the semiconductor device further comprising:

a body floating MOS transistor having an unfixed body potential, said SOI layer including a first region of a first conductivity type having a first thickness, and a second region of said first conductivity type and selectively formed in said SOI layer independently of said first semiconductor region having a second thickness less than said first thickness, said MOS transistor being formed on said first region, said body floating MOS transistor being formed on said second region, said MOS transistor comprising, a body portion of a second conductivity type and including a body region, said body region being a region of said SOI layer which lies between said first and second semiconductor regions, a gate electrode formed on a gate oxide film formed on said body region, and at least one body contact electrically connected to said body portion and receiving a fixed potential, said MOS transistor being formed by a method comprising the steps of:

(a) providing an operating frequency of said predetermined clock; and (b) determining a layout pattern of said MOS transistor based on the operating frequency of said predetermined clock, wherein the layout pattern of said MOS transistor is determined in said step (b) so as to satisfy the conditional expression $R \cdot C \cdot f < 1$ where C=the gate capacitance of said MOS transistor, R=the resistance of a fixed potential transmission path extending from said at least one body contact to said body region, f=the operating frequency of said predetermined clock, and f>500 MHZ, wherein said resistance R of said fixed potential transmission path is determined by $R = (\rho \cdot W)/(L \cdot t_{SOI})$ where W=the length of said fixed potential transmission path in said body region along the gate width of said gate electrode, L=the length of said fixed potential transmission path in said body region along the gate length of said gate electrode, $t_{SOI}$=the thickness of said SOI layer, and $\rho$=the resistivity of said body region.

17. A computer readable recording medium which records thereon a program for embodying the method as recited in claim 1.

18. The semiconductor device according to claim 4, wherein said resistance R of said fixed potential transmission path is determined by $R = (\rho \cdot W)/(L \cdot t_{SOI})$ where W=the length of said fixed potential transmission path in said body region along the gate width of said gate electrode, L=the length of said fixed potential transmission path in said body region along the gate length of said gate electrode, $t_{SOI}$=the thickness of said SOI layer, and $\rho$=the resistivity of said body region.

19. A semiconductor device including an MOS transistor formed on an SOI substrate including a supporting substrate, a buried oxide film and an SOI layer, said MOS transistor comprising:

a first semiconductor region of a first conductivity type and selectively formed in said SOI layer;

a second semiconductor region of said first conductivity type and selectively formed in said SOI layer independently of said first semiconductor region;

a body portion of a second conductivity type and including a body region, said body region being a region of said SOI layer which lies between said first and second semiconductor regions;

a gate electrode formed on a gate oxide film formed on said body region, said gate electrode being electrically connected to said body portion; and at least one body contact electrically connected to said body portion and receiving a fixed potential, said MOS transistor being formed by a method comprising the steps of:

(a) providing a signal propagation delay time required for said MOS transistor; and (b) determining a layout pattern of said MOS transistor based on said signal propagation delay time, wherein the layout pattern of said MOS transistor is determined in said step (b) so as to satisfy the conditional expression $$(R \cdot C)/td < 1$$

where

C = the gate capacitance of said MOS transistor,

R = the resistance of a fixed potential transmission path extending from said at least one body contact to said body region, td = signal propagation delay time (s) required for said MOS transistor, and td < 50 ps, wherein said resistance R of said fixed potential transmission path is a determined by $$R = (\rho \cdot W)/(L \cdot t_{SOI})$$

where

W = the length of said fixed potential transmission path in said body region along the gate width of said gate electrode, L = the length of said fixed potential transmission path in said body region along the gate length of said gate electrode, $t_{SOI}$ = the thickness of said SOI layer, and $\rho$ = the resistivity of said body region, and wherein said body portion includes a region extending from said body region in abutting relation with at least part of an outer periphery of said first and second semiconductor regions, said MOS transistor further comprising an isolation electrode formed on an insulating film formed on part of said body portion which is other than said body region and is in abutting relation with at least part of the outer periphery of said first and second semiconductor regions, said at least one body contact including an out-of-isolation-electrode body contact formed on a region of said body portion which is opposed, as seen in plan view, to said first and second semiconductor regions with said isolation electrode therebetween.

20. A computer readable recording medium which records thereon a program for embodying the method as recited in claim 2.

* * * * *